US012482919B2

(12) United States Patent
Zhang et al.

(10) Patent No.: US 12,482,919 B2
(45) Date of Patent: Nov. 25, 2025

(54) DISPLAY PANEL

(71) Applicants: Beijing BOE Technology Development Co., Ltd., Beijing (CN); BOE TECHNOLOGY GROUP CO., LTD., Beijing (CN)

(72) Inventors: Yafei Zhang, Beijing (CN); Dongdong Zhang, Beijing (CN); Xudong Zhang, Beijing (CN); Mengwen Jia, Beijing (CN); Mengxia Yu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/283,505

(22) PCT Filed: Feb. 17, 2023

(86) PCT No.: PCT/CN2023/076797
§ 371 (c)(1),
(2) Date: Sep. 22, 2023

(87) PCT Pub. No.: WO2024/168815
PCT Pub. Date: Aug. 22, 2024

(65) Prior Publication Data
US 2025/0038396 A1 Jan. 30, 2025

(51) Int. Cl.
*H01Q 1/22* (2006.01)
*H01Q 1/24* (2006.01)
(Continued)

(52) U.S. Cl.
CPC ............. *H01Q 1/2283* (2013.01); *H01Q 1/50* (2013.01); *H10K 59/40* (2023.02)

(58) Field of Classification Search
CPC ........ H01Q 1/22; H01Q 1/2283; H01Q 1/243; H01Q 1/36; H01Q 1/38; H01Q 1/50; H01Q 21/065; H01Q 21/08
See application file for complete search history.

(56) References Cited

U.S. PATENT DOCUMENTS 9,905,937 B1 * 2/2018 Chiang ................ H01Q 21/065
2022/0263220 A1 8/2022 Huang et al.
2022/0263238 A1 8/2022 Huang et al.

FOREIGN PATENT DOCUMENTS

CN 111864341 A 10/2020
CN 112306299 A 2/2021
(Continued)

*Primary Examiner* — Hoang V Nguyen
(74) *Attorney, Agent, or Firm* — HOUTTEMAN LAW LLC

(57) ABSTRACT

The present disclosure provides a display panel, and belongs to the field of display technology. The display panel includes a display module and an antenna module located on a side of a display surface of the display module; the antenna module includes an antenna unit; the antenna unit includes a dielectric substrate, a radiation structure arranged on the dielectric substrate, a first feed line and a second feed line, the first feed line and the second feed line feed the radiation structure and are electrically connected with the radiation structure, and feeding directions of the first feed line and the second feed line are different; the radiation structure includes radiation patches for at least two radiation frequency bands, and the radiation patches are electrically connected.

17 Claims, 18 Drawing Sheets

(51) Int. Cl.
*H01Q 1/50* (2006.01)
*H10K 59/40* (2023.01)

(56) References Cited

FOREIGN PATENT DOCUMENTS

| | | | | | |
|---|---|---|---|---|---|
| CN | 113054425 | A | | 6/2021 | |
| CN | 115377320 | A | | 11/2022 | |
| CN | 115377655 | A | | 11/2022 | |
| CN | 115441158 | A | * | 12/2022 | ............... H01Q 1/22 |
| EP | 2795726 | B1 | | 10/2016 | |
| WO | WO2021082968 | A1 | | 5/2021 | |
| WO | WO2022246814 | A1 | | 12/2022 | |
| WO | WO2022252170 | A1 | | 12/2022 | |
| WO | WO2022252899 | A1 | | 12/2022 | |

* cited by examiner

DISPLAY PANEL

TECHNICAL FIELD

The present disclosure relates to the field of display technology, and particularly relates to a display panel.

BACKGROUND

Millimeter wave technology is the most critical technology for the fifth generation mobile communication system to realize wireless communication with a high data rate. The international standardization organization 3GPP (Third Generation Partnership Project) for the fifth generation mobile communication system (5G system) divides a frequency band for 5G into a FR1 frequency band and a FR2 frequency band, with the FR1 frequency ranging from 450 MHz to 6 GHZ, and being also called a Sub-6 GHZ frequency band and the FR2 frequency band ranging from 24.25 GHz to 52.6 GHz and being also called a millimeter wave frequency band. The FR1 and FR2 frequency bands each are further subdivided into a plurality of sub-frequency-bands, which are represented by different frequency band numbers based on a determined duplex mode (FDD/TDD). The sub-frequency-bands of the millimeter wave band for 5G includes: n257 (26.5 GHZ-29.5 GHZ), n258 (24.25 GHz-27.5 GHZ), n259 (39.5 GHZ-43.5 GHZ), n260 (37.0 GHz-40.0 GHz) and n261 (27.5 GHZ-28.35 GHz), generally, the sub-frequency-bands of n257, n258 and n261 are classified into 28 GHz frequency band, and the sub-frequency-bands of n259 and n260 are classified into 39 GHz frequency band. The sub-frequency-band of n257 is partially overlapped with the sub-frequency-bands of n258 and n261. According to statistics conducted by GSA (GlobalMobile Suppliers Association) in May 2021, a total of 112 operators worldwide have held licenses for 26/28 GHz mmwave for 5G, and 27 operators have deployed or are actually deploying 5G networks using the 26/28 GHz mmwave. There are 27 operators holding licenses for the 39 GHz frequency band, and mainly located in the United States. At present, although the specific planning relating to the millimeter wave spectrum in China is not formally released, the country and the industry have payed high attention to the promotion of the related work.

With the popularization and application of millimeter waves, high-integrated antennas are desired more and more urgently. The dual-frequency-band antenna can reduce the number of antennas in the system, simplify the hardware structure and reduce the cost of the system. The dual-polarized antenna technology adopts antennas with polarizations orthogonal to each other to work simultaneously in a transceiving duplex mode by utilizing incoherence of orthogonal electromagnetic waves and multipath transmission effect of signals, thus can well solve the problems of multipath fading, mismatch between polarizations and the like during transmission of the electromagnetic waves, and improve the communication capacity of the system. In view of above, in terms of the field of antenna technology, designing a dual-frequency-band and dual-polarization antenna capable of covering 28/39 Ghz has important research significance.

SUMMARY

The present disclosure is directed to at least one of the problems in the related art, and provides a display panel.

Embodiments of the present disclosure provide a display panel, which includes a display module and an antenna module located on a side of a display surface of the display module, where the antenna module includes an antenna unit; the antenna unit includes a dielectric substrate, a radiation structure arranged on the dielectric substrate, a first feed line and a second feed line electrically connected with the radiation structure and feeding the radiation structure, feeding directions of the first feed line and the second feed line are different; the radiation structure includes radiation patches for at least two radiation frequency bands, and the radiation patches are electrically connected.

In some implementations, the radiation structure includes radiation patches for two radiation frequency bands, including first radiation patches and second radiation patches; the radiation frequency band of the first radiation patches is smaller than that of the second radiation patches; the first feed line and the second feed line are both electrically connected with the first radiation patches.

In some implementations, the number of the first radiation patches is four, and connection lines connecting centers of the four first radiation patches constitutes a virtual quadrangle; the second radiation patches are arranged on four sides of the virtual quadrangle and inside the virtual quadrangle, and each of the second radiation patches located on the four sides of the virtual quadrangle is arranged between two adjacent first radiation patches.

In some implementations, four vertices of the virtual quadrangle include a first vertex and a second vertex arranged along a first direction, and a third vertex and a fourth vertex arranged along a second direction, respectively; the first feed line is electrically connected with the first radiation patch with the center being located at the first vertex, and the second feed line is electrically connected with the second radiation patch with a center being located at the second vertex.

In some implementations, the first feed line is connected to the first radiation patch corresponding thereto at a first node, and the second feed line is connected to the first radiation patch corresponding thereto at a second node; a connection line between the first node and the first vertex is a first line segment, and a connection line between the second node and the second vertex is a second line segment; an extending direction in which the first line segment extends and an extending direction in which the second line segment extends are perpendicular to each other.

In some implementations, four vertices of the virtual quadrangle include a first vertex and a second vertex arranged along a first direction, and a third vertex and a fourth vertex arranged along a second direction, respectively; the first feed line includes a first feed end and two second feed ends; the second feed line includes a third feed end and two fourth feed ends; one of the second feed ends is electrically connected with the first radiation patch located on the first vertex at a third node; the other of the second feed ends is electrically connected with the first radiation patch located on the third vertex at a fourth node; one of the fourth feed ends is electrically connected with the first radiation patch located on the second vertex at a fifth node, and the other of the fourth feed ends is electrically connected with the first radiation patch located on the third vertex at a sixth node; a connection line between the third node and the first vertex is a third line segment, a connection line between the fourth node and the third vertex is a fourth line segment, a connection line between the fifth node and the second vertex is a fifth line segment, and a connection line between the sixth node and the third vertex is a sixth line segment; an extending direction in which the third line segment extends is the same as an extending direction in which the fourth line segment extends, an extending direction in which the fifth line segment extends is the same as an extending direction in which the sixth line segment extends, and the extending direction in which the third line segment extends is different from the extending direction in which the fifth line segment extends.

In some implementations, the extending direction in which the third line segment extends and the extending direction in which the fifth line segment extends are perpendicular to each other.

In some implementations, at least one of the second radiation patches located on the four sides of the virtual quadrangle is connected to one of the first radiation patches adjacent thereto through a connection bar.

In some implementations, for any second radiation patch located on the side of the virtual quadrilateral, the center of the second radiation patch is located on the side of the virtual quadrilateral.

In some implementations, for any second radiation patch located on the side of the virtual quadrilateral, the center of the second radiation patch is located at a midpoint of the side of the virtual quadrilateral.

In some implementations, the center of each of at least a part of the second radiation patches is located on a side of the side of the virtual quadrilateral away from a center of the virtual quadrilateral.

In some implementations, for a part of the first radiation patches and the second radiation patches that are located on the same side of the virtual quadrangle, the first radiation patch and the second radiation patch each have a first side edge that is away from the center of the virtual quadrangle and parallel to the side of the virtual quadrangle on which they are located, and first side edges of the first radiation patch and the second radiation patch are located on a same straight line.

In some implementations, the center of each of at least a part of the second radiation patches is located on a side of the side of the virtual quadrilateral close to the center of the virtual quadrilateral.

In some implementations, for at least a part of the first radiation patches and the second radiation patches that are located on the same side of the virtual quadrilateral, the first radiation patch and the second radiation patch each have a second side edge that is close to the center of the virtual quadrilateral and parallel to the side of the virtual quadrilateral on which they are located, and second side edges of the first radiation patch and the second radiation patch are located on a same straight line.

In some implementations, for the second radiation patch located at the center of the virtual quadrangle, an auxiliary radiation patch is connected to at least one side of the second radiation patch.

In some implementations, for the second radiation patch located at the center of the virtual quadrilateral, the center of the second radiation patch is located at the center of the virtual quadrilateral.

In some implementations, each of the radiation patches includes a plurality of first traces and a plurality of second traces, and the first traces and the second traces are intersected to define a plurality of hollow-out portions.

In some implementations, ends of the first traces and ends of the second traces of the radiation patches are separated from each other at edges of each of the radiation patches.

In some implementations, ends of the first traces of the radiation patches are respectively connected to the second traces at edges of the radiation patches, and ends of the second traces are respectively connected to the first traces at edges of the radiation patches.

In some implementations, the antenna module includes a radiation layer on a side of a display surface of the display panel; the radiation structure in the antenna unit is located in the radiation layer and the radiation layer further includes a redundant radiation structure.

In some implementations, the radiation layer includes a plurality of first traces and a plurality of second traces, which are intersected, and the first traces and the second traces are broken between the radiation structure and the redundant radiation structure.

In some implementations, a touch control component is integrated in the display module.

DETAIL DESCRIPTION OF EMBODIMENTS

In order to make the technical solutions of the present disclosure better understood, the present disclosure is further described in detail below with reference to the accompanying drawings and the detailed description.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word includes the element or item listed after the word and its equivalent, but does not exclude other elements or items. The terms "connected/coupled" or "connecting/coupling" and the like are not restricted to physical or mechanical connections, but may include electrical connections, whether direct or indirect. "Upper/On", "lower/under", "left", "right", and the like are used only to indicate relative positional relationships, and when the absolute position of the object being described is changed, the relative positional relationships may be changed accordingly.

Figure 1:
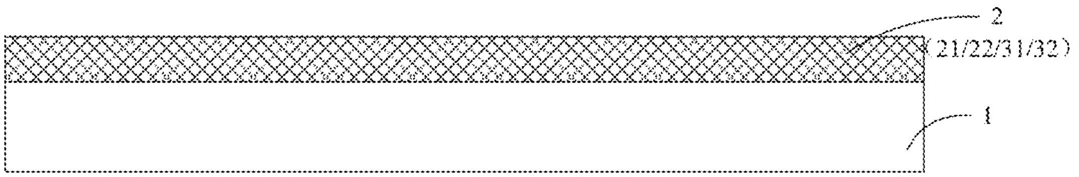
FIG. 1 is a schematic diagram illustrating film layers of a display panel according to an embodiment of the present disclosure.

In a first aspect, FIG. 1 is a schematic diagram illustrating film layers of a display panel according to an embodiment of the present disclosure; as shown in FIG. 1, the embodiment of the present disclosure provides a display panel, which includes a display module 1 and an antenna module 2 located on a side of a light-emitting surface of the display module 1. The antenna module 2 includes at least one antenna unit, the antenna unit includes a dielectric substrate, a radiation structure disposed on the dielectric substrate, and a first feed line 31 and a second feed line 32 that feed the radiation structure and are electrically connected to the radiation structure, feeding directions of the first feed line 31 and the second feed line 32 are different. The radiation structure in the antenna unit of the embodiment of the present disclosure includes radiation patches for at least two radiation frequency bands, and the radiation patches are electrically connected with each other. That is to say, the antenna unit in the embodiment of the present disclosure is a common-caliber multi-wideband dual-polarized antenna.

In the embodiment of the present disclosure, the common-caliber multi-broadband dual-polarized antenna is integrated in the display panel, so that the display panel can meet the requirement of wider bandwidth for the frequency band, and have higher applicability. In addition, in the embodiment of the present disclosure, the antenna module 2 is disposed on a side of a display surface of the display module 1, and a conductive film structure in the display module 1 may serve as a reference ground (a reflective layer) in the antenna module 2, since no additional reference ground is desired to be provided in the antenna module 2, the display panel can be lighter and thinner.

Figure 2:
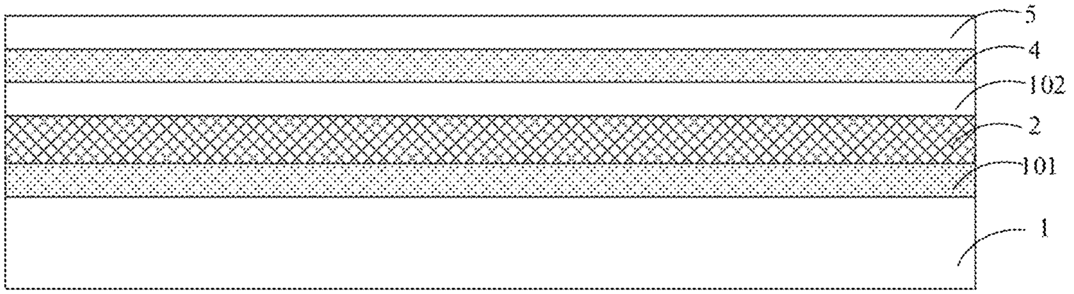
FIG. 2 is a schematic diagram illustrating film layers of a display panel according to an embodiment of the present disclosure.

In some examples, FIG. 2 is another schematic diagram illustrating film layers of a display panel according to an embodiment of the present disclosure, as shown in FIG. 2, the display module 1 in the embodiment of the present disclosure may be specifically an OLED (Organic Light-Emitting Diode) display module 1, the antenna module 2 is disposed on a side of a light-emitting surface of the OLED display module 1, and the display panel further includes a polarizer 4 and a cover glass 5 disposed on a side of the antenna module 2 away from the OLED display module 1. The antenna module 2 may be fixed together with the display module 1 through a transparent optical conductive adhesive 101 (OCA adhesive); the cover glass 5 and the polarizer 4 may be fixed together by a transparent optical conductive adhesive 102 as well.

Furthermore, a touch control component is integrated in the display module 1 of the embodiment of the present disclosure, that is, the display panel of the embodiment of the present disclosure has a touch function.

In some examples, the radiation structure of the antenna unit of the embodiment of the present disclosure includes radiation patches for two radiation frequency bands, including a first radiation patch 21 and a second radiation patch 22; the radiation frequency band of the first radiation patch 21 is smaller than that of the second radiation patch 22, that is, the first radiation patch 21 is a low frequency radiation patch, and the second radiation patch 22 is a high frequency radiation patch. In the embodiment of the present disclosure, a first feed line 31 and a second feed line 32 are both electrically connected to the first radiation patch 21. For example, the first radiation patch 21 radiates at a frequency near or approximate to 26 GHz frequency and the second radiation patch 22 radiates at a frequency near or approximate to 39 GHz frequency.

In addition, since the radiation frequency of the first radiation patch 21 is lower than the radiation frequency of the second radiation patch 22, a size of the first radiation patch 21 is larger than that of the second radiation patch 22. In the embodiment of the present disclosure, as an example, the first radiation patch 21 and the second radiation patch 22 are square patches, but it should be understood that the first radiation patch 21 and the second radiation patch 22 each may be a patch in any shape such as a triangle, a circle, a regular hexagon, a rectangle, and the like.

In some examples, the radiation structure, the first feed line 31, and the second feed line 32 in the embodiment of the present disclosure may be disposed in a same layer and made of a same material, which helps to achieve lightness and thinness of the display panel.

Furthermore, the radiation structure, the first feed line 31 and the second feed line 32 in the embodiment of the present disclosure are disposed on a side of the dielectric substrate away from the display module 1, the dielectric substrate may be made of COP (Cyclo Olefin Polymers) basic material, and the COP basic material has a transmittance greater than or equal to 89%, and thus has high transparency, and can reduce the influence on the transmittance of the display panel. Certainly, the dielectric substrate is not limited to be made of the COP basic material, and may be made of other materials having high transparency, such as PET (Polyethylene terephthalate), CPI (color Polyimide), glass, or the like.

In order to make the structure of the antenna module 2 in the display panel in the embodiment of the present disclosure more clear, the antenna module 2 in the embodiment of the present disclosure is described below with reference to specific examples.

A First Example

Figure 3:
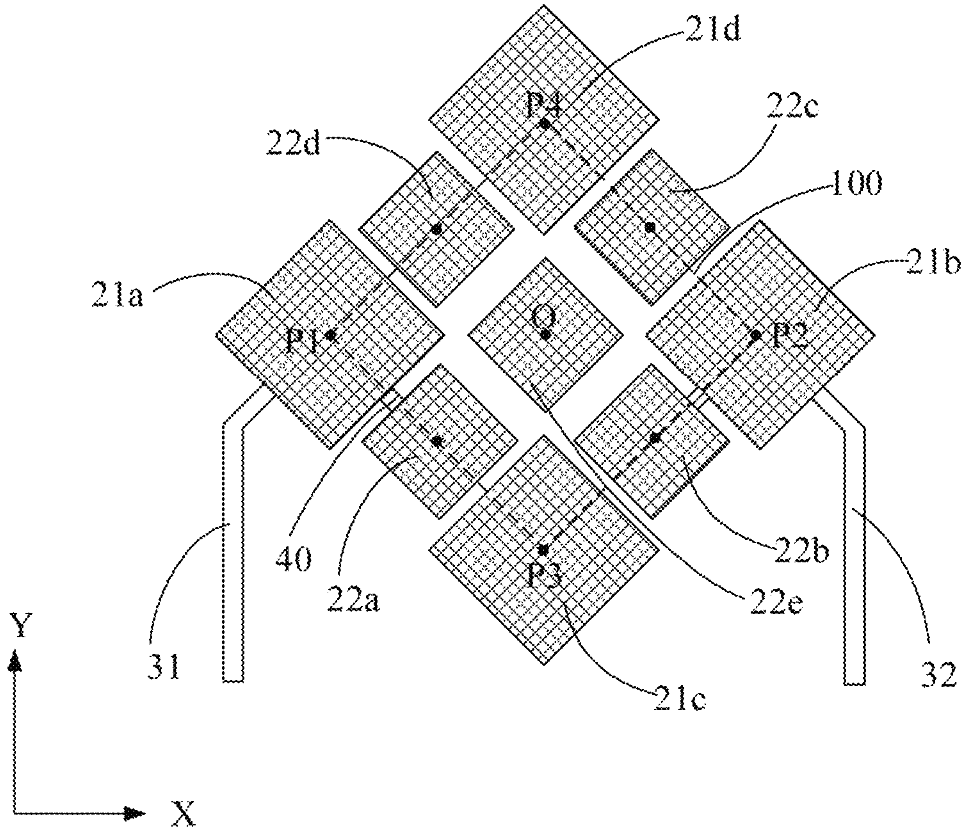
FIG. 3 is a schematic diagram of an antenna unit in a display panel in a first example of the present disclosure.

FIG. 3 is a schematic diagram of an antenna unit in a display panel in the first example of the present disclosure; as shown in FIG. 3, the antenna module 2 in the display panel includes a plurality of antenna units arranged in an array, each antenna unit includes four first radiation patches 21 and five second radiation patches 22. Connection lines connecting centers of the four first radiation patches 21 form a virtual quadrangle 100, that is, four vertices of the virtual quadrangle 100 are the centers of the four first radiation patches 21, respectively. Each of four sides of the virtual quadrangle 100 is provided with one second radiation patch 22 thereon, and each virtual quadrangle 100 is provided with one second radiation patch 22 inside thereof. Referring to FIG. 3, for the second radiation patch 22 on each side of the virtual quadrangle 100, a center of the second radiation patch 22 is located on the side of the virtual quadrangle 100, for example, the center of the second radiation patch 22 is located at a midpoint of the side of the virtual quadrangle 100. A center of the second radiation patch 22 located inside the virtual quadrangle 100 coincides with a center O of the virtual quadrangle 100.

Furthermore, the four vertices of the virtual quadrangle 100 include a first vertex P1 and a second vertex P2 disposed along a first direction X, and a third vertex P3 and a fourth vertex P4 disposed along a second direction Y, respectively. The center of the first radiation patch 21*a* is located at the first vertex P1, the center of the first radiation patch 21*b* is located at the second vertex P2, the center of the first radiation patch 21*c* is located at the third vertex P3, and the center of the first radiation patch 21*d* is located at the fourth vertex P4. In this example, the first feed line 31 is electrically connected to the first radiation patch 21*a* at a first node; the second feed line 32 is electrically connected to the first radiation patch 21*b* at a second node. In the embodiment of the present disclosure, a connection line between the first node and the first vertex P1 is a first line segment, and a connection line between the second node and the second vertex P2 is a second line segment. An extending direction in which the first line segment extends is perpendicular to an extending direction in which the second line segment extends. That is, the feeding direction of the first feed line 31 and the feeding direction of the second feed line 32 are different by 90°.

In some examples, furthermore, as shown in FIG. 3, the second radiation patch 22*a* located on the side of the virtual quadrangle 100 is electrically connected to the first radiation patch 21*a* through a connection bar, and the second radiation patch 22*b* is electrically connected to the first radiation patch 21*a* through a connection bar.

Certainly, in the embodiment of the present disclosure, the first radiation patch 21 and the second radiation patch 22 may be connected without the connection bar, for example, the first radiation patch 21 and the second radiation patch 22 may be electrically coupled, any case which can ensure that the first radiation patch 21 and the second radiation patch 22 can be electrically connected with each other, falls within the protective scope of the embodiment of the present disclosure.

In some examples, each of the first radiation patch 21 and the second radiation patch 22 includes a plurality of first traces 201 and a plurality of second traces 202, and the first traces 201 and the second traces 202 are intersected to define a plurality of hollow-out portions. That is, the first radiation patch 21 and the second radiation patch 22 each adopt a mesh structure, so that light transmittance of the display panel can be improved.

It should be noted that, the greater the number of the hollow-out portions is, the higher the transmittance of each of the first radiation patches 21 and the second radiation patches 22 is, but in this case, an effective area of each of the first radiation patches 21 and the second radiation patches 22 may be reduced, which may result in a reduction in radiation efficiency, and thus coupling between the first radiation patch 21 and the second radiation patch 22 for outputting an electromagnetic wave will result in lower radiation efficiency of the antenna module 2, and therefore, the second radiation patch may be directly connected to the first radiation patch through the connection bar. In addition, in the embodiment of the present disclosure, the antenna module 2 is provided in consideration of the radiation efficiency and the transmittance, and in this case, parameters such as a line width, a line thickness of each of the first traces 201 and the second traces 202, line pitches between the first traces 201, line pitches between the second trances 202, and the like in the first radiation patches 21 and the second radiation patches 22 are desired to be set reasonably.

A Second Example

Figure 4:
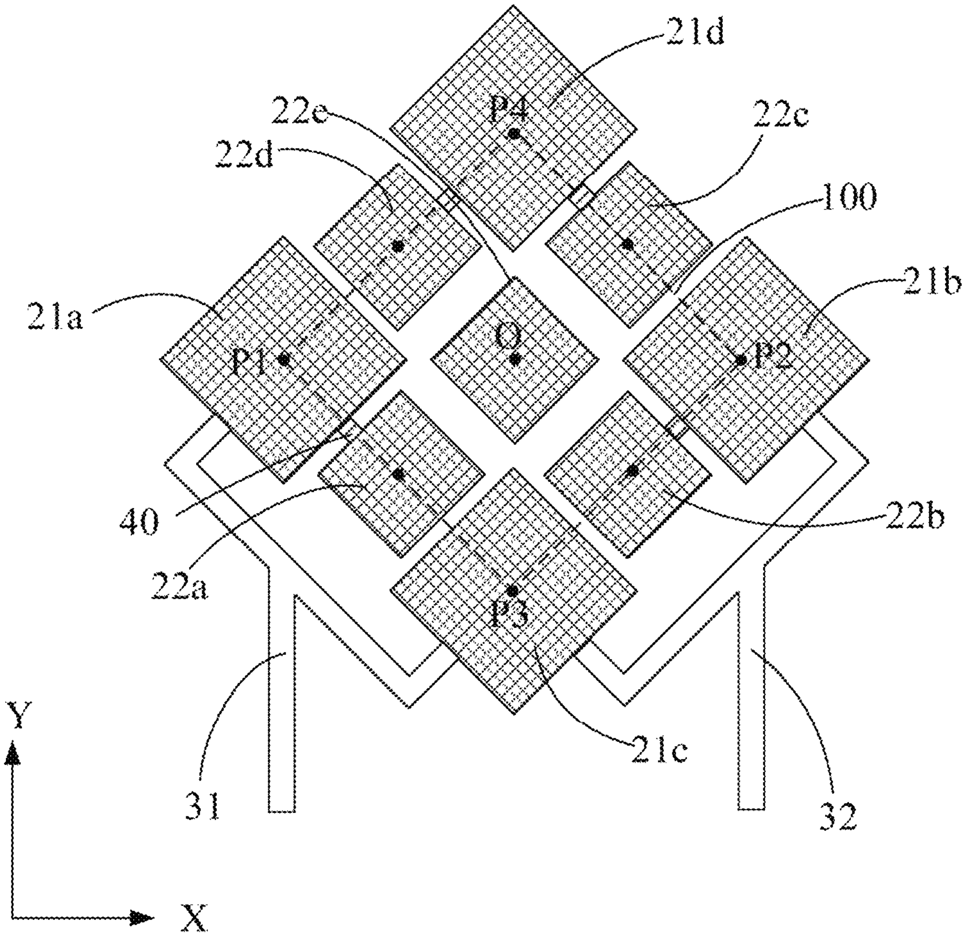
FIG. 4 is a schematic diagram of an antenna unit in a display panel in a second example of the present disclosure.

FIG. 4 is a schematic diagram of an antenna unit in a display panel in the second example of the present disclosure, as shown in FIG. 4, the antenna module 2 in the display panel includes a plurality of antenna units arranged in an array, each antenna unit includes four first radiation patches 21 and five second radiation patches 22. Connection lines connecting centers of the four first radiation patches 21 form a virtual quadrangle 100, that is, four vertices of the virtual quadrangle 100 are the centers of the four first radiation patches 21, respectively. Each of four sides of the virtual quadrangle 100 is provided with one second radiation patch 22 thereon, and each virtual quadrangle 100 is provided with one second radiation patch 22 inside thereof. Referring to FIG. 4, for the second radiation patch 22 on each side of the virtual quadrangle 100, the center of the second radiation patch 22 is located on the side of the virtual quadrangle 100, for example, the center of the second radiation patch 22 is located at a midpoint of the side of the virtual quadrangle 100. The center of the second radiation patch 22 located inside the virtual quadrangle 100 coincides with a center O of the virtual quadrangle 100.

Furthermore, the four vertices of the virtual quadrangle 100 include a first vertex P1 and a second vertex P2 disposed along a first direction X, and a third vertex P3 and a fourth vertex P4 disposed along a second direction Y, respectively. The center of the first radiation patch 21*a* is located at the first vertex P1, the center of the first radiation patch 21*b* is located at the second vertex P2, the center of the first radiation patch 21*c* is located at the third vertex P3, and the center of the first radiation patch 21*d* is located at the fourth vertex P4. In this example, the first feed line 31 and the second feed line 32 each are a one-to-two feed line i.e., the first feed line 31 has one first feed end and two second feed ends and the second feed line 32 has one third feed end and two fourth feed ends. One of the second feed ends of the first feed line 31 is electrically connected to the first radiation patch 21*a* at a third node, and the other of the second feed ends of the first feed line 31 is electrically connected to the first radiation patch 21*c* at a fourth node. One of the fourth feed ends of the second feed line 32 is electrically connected to the first radiation patch 21*b* at a fifth node, and the other of the fourth feed ends of the second feed line 32 is electrically connected to the first radiation patch 21*c* at a sixth node. A connection line between the third node and the first vertex P1 of the virtual quadrangle 100 is a third line segment, a connection line between the fourth node and the third vertex P3 of the virtual quadrangle 100 is a fourth line segment, a connection line between the fifth node and the second vertex P2 of the virtual quadrangle 100 is a fifth line segment, and a connection line between the sixth node and the third vertex P3 of the virtual quadrangle 100 is a sixth line segment; an extending direction in which the third line segment extends is the same as an extending direction in which the fourth line segment extend, an extending direction in which the fifth line segment extends is the same as an extending direction in which the sixth line segment extends, and the extending direction in which the third line segment extends is different from the extending direction in which the fifth line segment extends. For example, the extending direction in which the third line segment extends is perpendicular to the extending direction in which the fifth line segment extends. That is, the feeding direction of the first feed line 31 and the feeding direction of the second feed line 32 are different by 90°.

In this example, the first feed line 31 and the second feed line 32 each are directly connected to low frequency radiation patches, that is, the first radiation patches 21, respectively, and the current preferentially resonates at the low frequency radiation patches. In order to increase radiation at a high frequency, the first radiation patch 21 and the second radiation patch 22 adjacent to the first radiation patch 21 may be connected by a connection bar, thereby facilitating the current circulation. For example, at least a part of the second radiation patches 22 are connected to one of the first radiation patches adjacent thereto, and furthermore, the second radiation patches 22 may be connected to the first radiation patches 21 electrically connected with the first feed line 31/the second feed line 32 by connection bars.

Specifically, referring to FIG. 4, in the embodiment of the present disclosure, the second radiation patch 22*a* is connected to the first radiation patch 21*a* by a connection bar, the second radiation patch 22*b* is connected to the first radiation patch 21*b* by a connection bar, and the second radiation patch 22*c* and the second radiation patch 22*d* are respectively connected to the first radiation patch 21*d* by connection bars.

Figure 5:
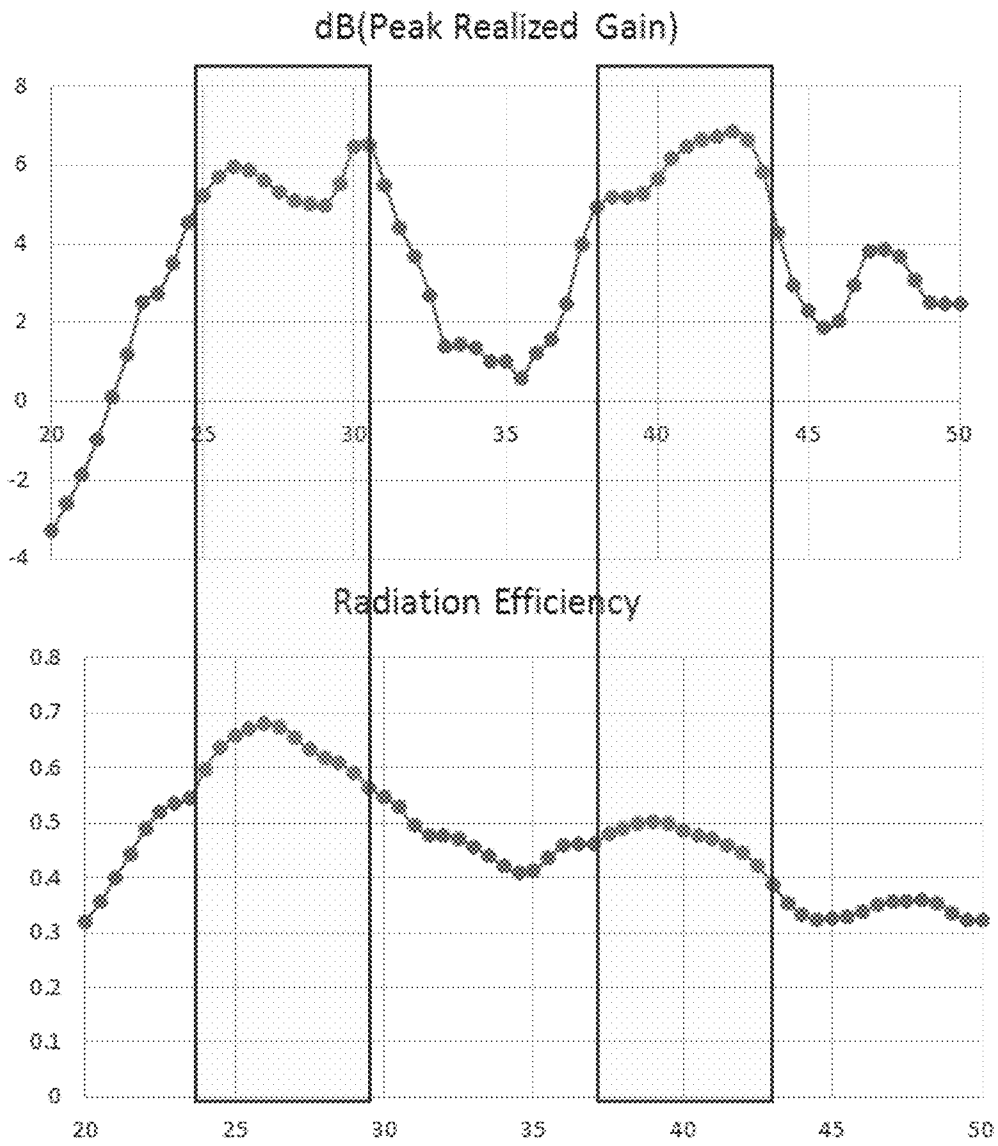
FIG. 5 is a graph illustrating a simulation of radiation efficiency and gain of the antenna unit shown in FIG. 4.

FIG. 5 is a graph illustrating a simulation of radiation efficiency and gain of the antenna unit shown in FIG. 4; referring to FIG. 5, it can be seen that since the first feed line 31 and the second feed line 32 are electrically connected to the low frequency radiation patches, the radiation efficiency of the antenna unit at the frequency near or approximate to 26 GHz is significantly higher than that at the frequency near or approximate to 39 GHz, and the antenna unit has gains greater than 5 dBi at frequencies near or approximate to 26 GHz and 39 GHz respectively.

Figure 6:
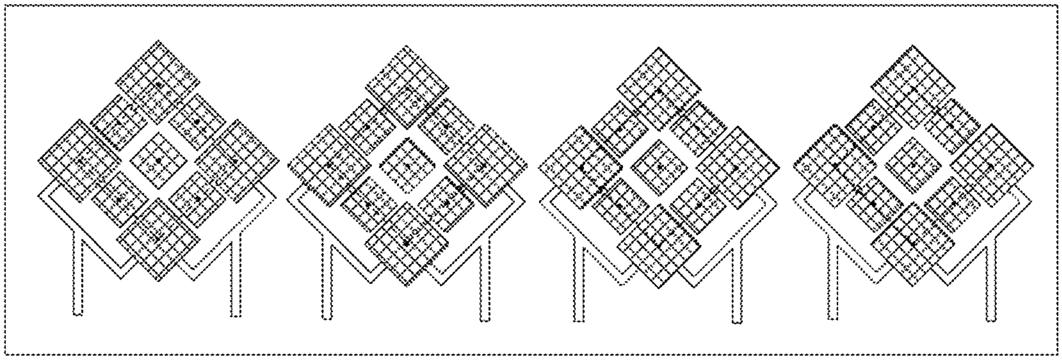
FIG. 6 is a schematic diagram of an antenna module including the antenna unit shown in FIG. 4.
Figure 7:
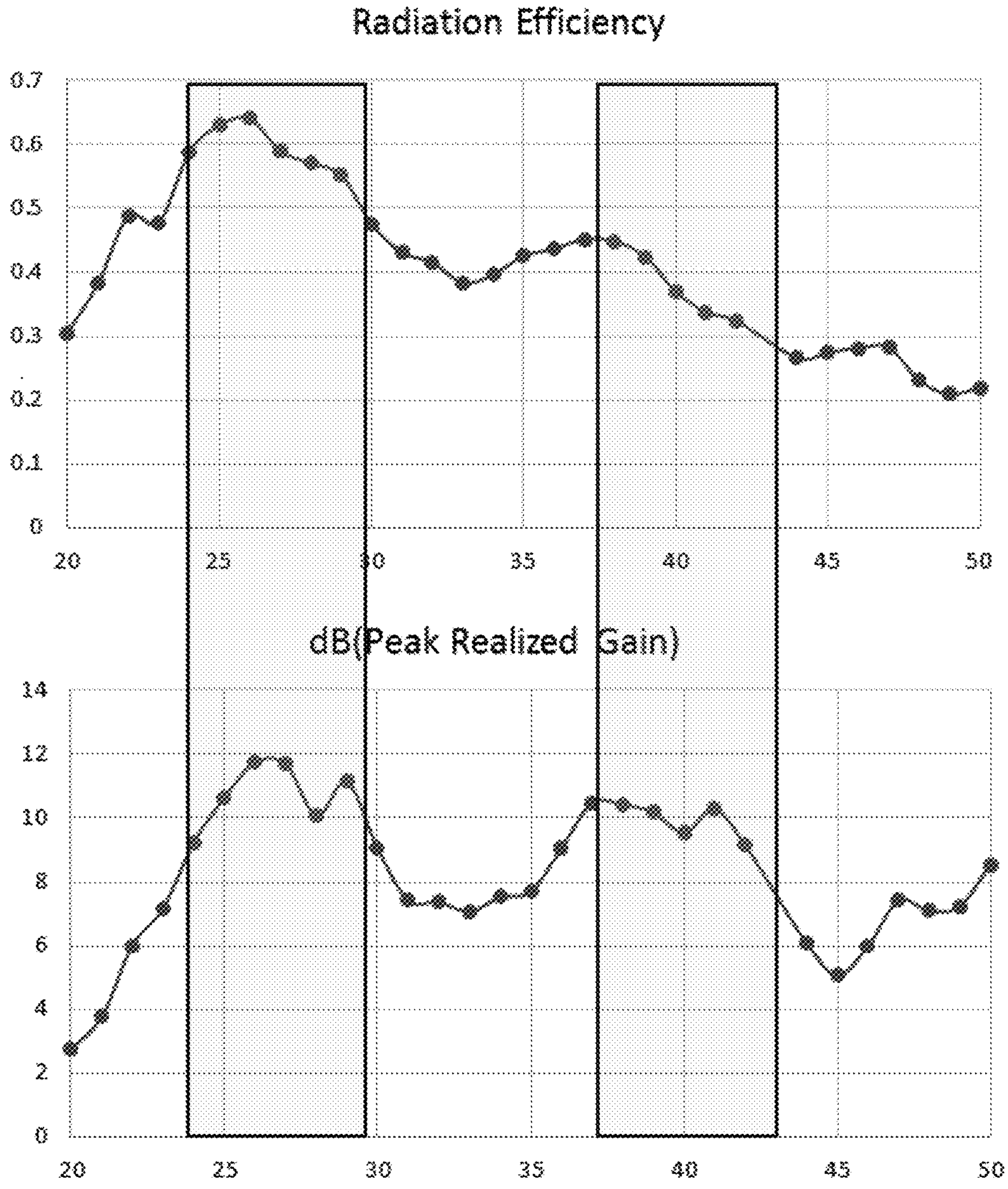
FIG. 7 is a graph illustrating a simulation of radiation efficiency and gain of the antenna unit shown in FIG. 6.

FIG. 6 is a schematic diagram of an antenna module 2 including the antenna unit shown in FIG. 4; FIG. 6 shows a schematic diagram of an antenna module 2 including 1×4 antenna units; FIG. 7 is a graph illustrating a simulation of radiation efficiency and gain of the antenna unit shown in FIG. 6; as shown in FIG. 7, similarly to the single antenna unit, the radiation efficiency at a frequency near or approximate to 26 GHz is significantly higher than that at a frequency near or approximate to 39 GHz, and the antenna unit has gains of about 10 dBi at frequencies near or approximate to 26 GHz and 39 GHz respectively.

Figure 8:
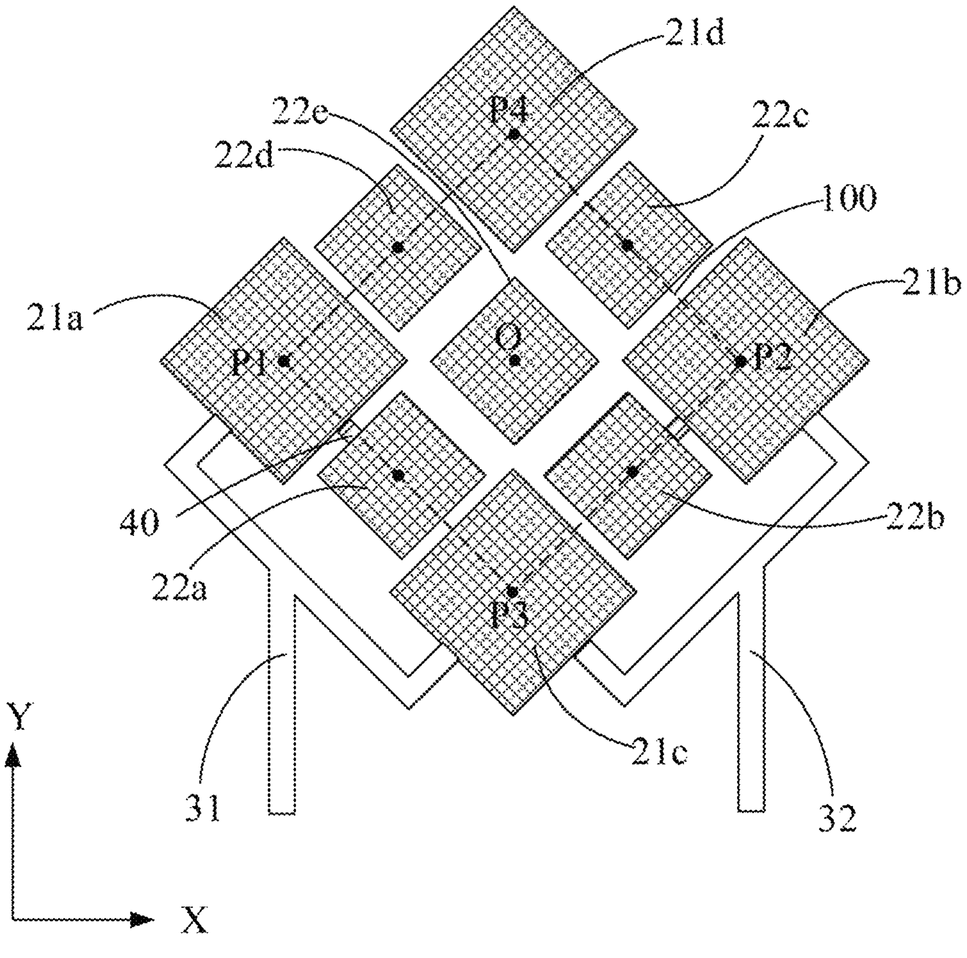
FIG. 8 is a schematic diagram of a variation of the antenna unit shown in FIG. 4.

FIG. 8 is a schematic diagram of a variation of the antenna unit shown in FIG. 4; as shown in FIG. 8, in the antenna unit, the second radiation patch 22*a* is connected to the first radiation patch 21*a* by a connection bar, and the second radiation patch 22*b* is connected to the first radiation patch 21*b* by a connection bar. That is, two connection bars are reduced in the antenna unit compared to the antenna unit shown in FIG. 4.

Figure 9:
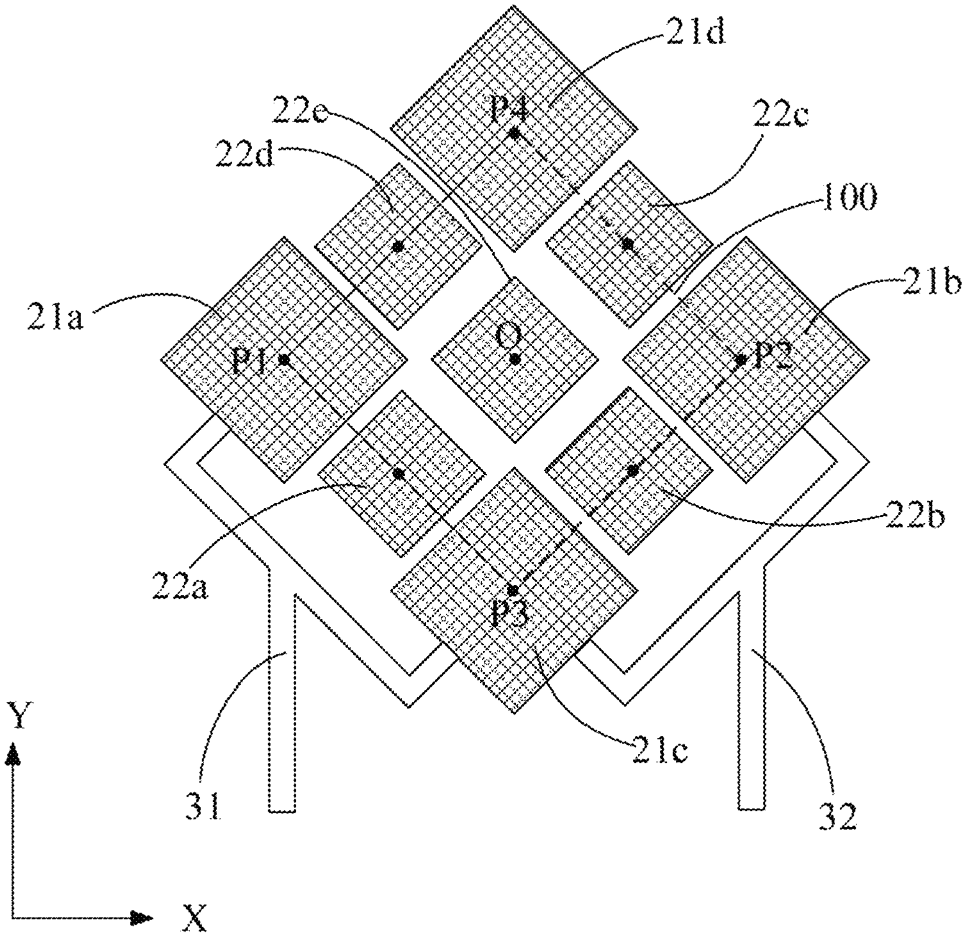
FIG. 9 is a schematic diagram of another variation of the antenna unit shown in FIG. 4.

FIG. 9 is a schematic diagram of another variation of the antenna unit shown in FIG. 4; as shown in FIG. 9, in some implementations of the present disclosure, the first radiation patch 21 may be connected to the second radiation patch 22 without the connection bar, for example, the first radiation patch 21 and the second radiation patch 22 may be coupled with each other, any case which can ensure that the first radiation patch 21 and the second radiation patch 22 can be electrically connected, falls within the protective scope of the embodiment of the present disclosure.

Figure 10:
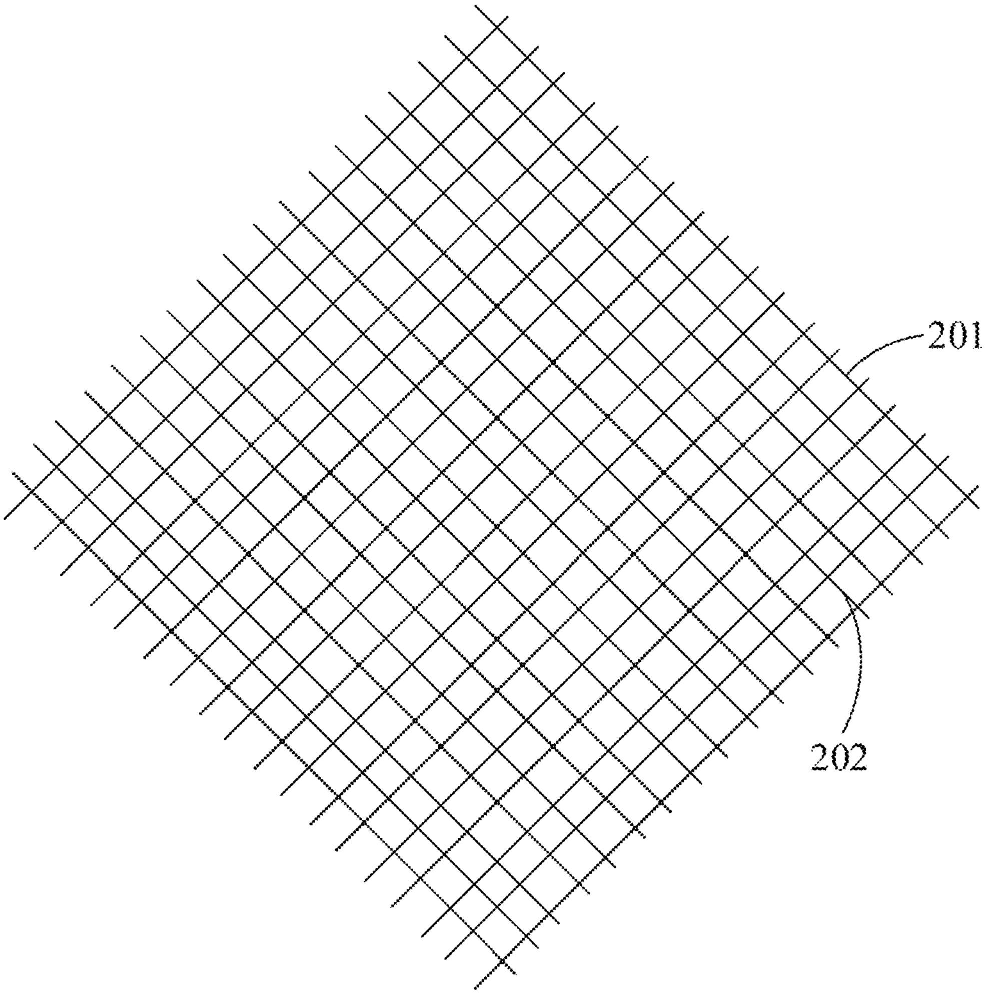
FIG. 10 is a schematic diagram of a radiation patch according to an embodiment of the present disclosure.
Figure 11:
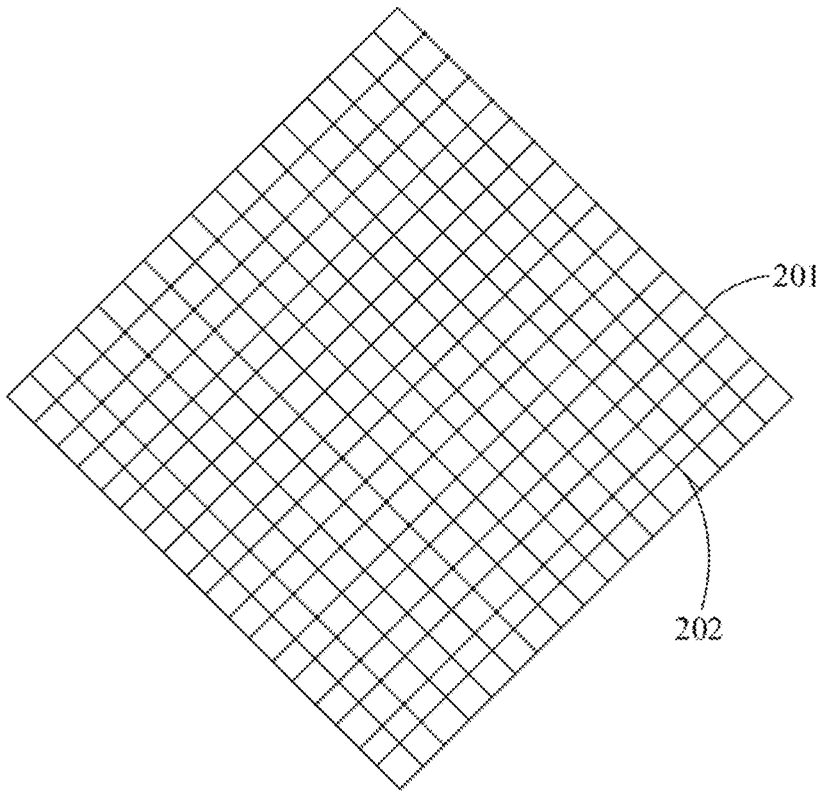
FIG. 11 is a schematic diagram of another radiation patch according to an embodiment of the present disclosure.

In some examples, FIG. 10 is a schematic diagram of a radiation patch according to an embodiment of the present disclosure; FIG. 11 is a schematic diagram of another radiation patch according to an embodiment of the present disclosure; as shown in FIGS. 10 and 11, each of the first radiation patches 21 and the second radiation patches 22 includes a plurality of first traces 201 and a plurality of second traces 202, and the first traces 201 and the second traces 202 are intersected to define a plurality of hollow-out portions. That is, the first radiation patches 21 and the second radiation patches 22 each adopt a mesh structure, so that the light transmittance of the display panel can be improved.

In the present embodiment, the first traces 201 are not necessarily perpendicular to the second traces 202, and although the first traces 201 and the second traces 202 are perpendicularly intersected in FIG. 10 and FIG. 11, in order to match with light emitting pixels and avoid moire fringes in practices, hollow-out portions in a shape of diamond grid are mostly adopted, and each included angle and each side length of each diamond in the shape of diamond grid are desired to be optically designed.

It should be noted that, the greater the number of the hollow-out portions is, the higher the transmittance of each of the first radiation patches 21 and the second radiation patches 22 is, but in this case, an effective area of each of the first radiation patches 21 and the second radiation patches 22 may be reduced, which may result in a reduction in radiation efficiency, and thus coupling between the first radiation patch 21 and the second radiation patch 22 for outputting an electromagnetic wave may result in a lower radiation efficiency of the antenna module 2, and therefore, the second radiation patch may be directly connected to the first radiation patche through a connection bar. In addition, in the embodiment of the present disclosure, the antenna module 2 is provided in consideration of the radiation efficiency and the transmittance, and in this case, parameters such as a line width, a line thickness of each of the first traces 201 and the second traces 202, line pitches between the first traces 201, line pitches between the second trances 202, and the like in the first radiation patches 21 and the second radiation patches 22 are desired to be set reasonably.

Furthermore, in a case where each of the first radiation patches 21 and the second radiation patches 22 is constituted by the first traces 201 and the second traces 202 intersected with each other, there may be two arrangements for edges of the first radiation patch 21 and the second radiation patch 22. Since the arrangements for the edges of the first radiation patch 21 and the second radiation patch 22 may be the same, only the arrangement for the edge of the first radiation patch 21 will be described below as an example.

Figure 12:
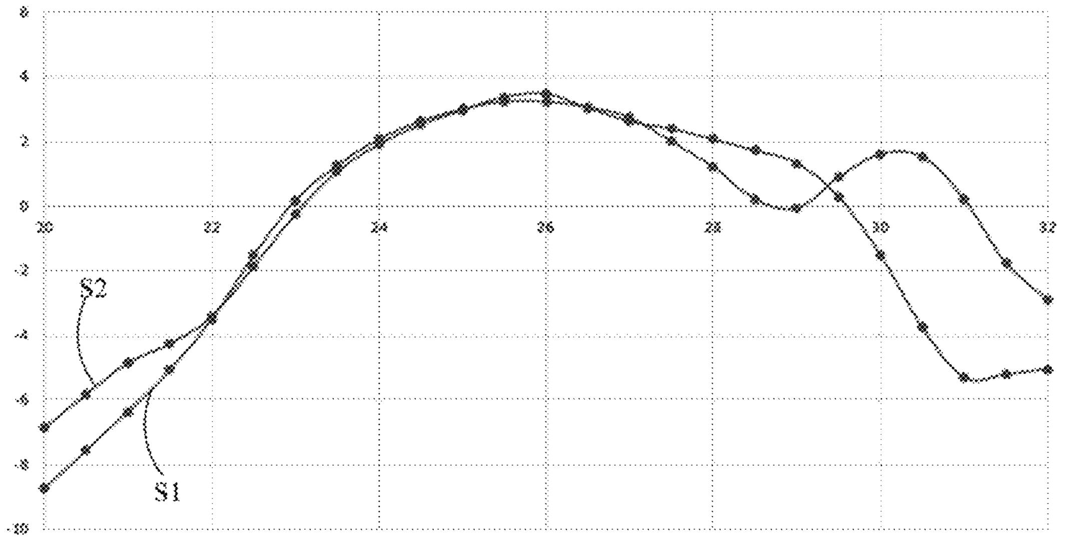
FIG. 12 is a graph illustrating a comparison of radiation and gain between the antenna unit consisting of the radiation patch shown in FIG. 10, and the antenna unit consisting of the radiation patch shown in FIG. 11.

In some examples, in any one of the first radiation patches 21, ends of the first traces 201 and ends of the second traces 202 are separated from each other at the edge of the first radiation patch 21, i.e., the edge of the first radiation patch 21 is discontinuous. In other examples, in any one of the first radiation patches 21, ends of the first traces 201 are connected to the second traces 202, and ends of the second traces 202 are connected to the first traces 201, in such case, all the hollow-out portions formed by the first radiation patches 21 are complete hollow-out patterns. In this case, the first radiation patch 21 has a relatively complete outer contour, and accordingly, the same structure is adopted for the second radiation patch 22, and since the first radiation patch 21 and the second radiation patch 22 mainly excite resonance by surfaces thereof, a complete structure thereof facilitates the radiation. Specifically, FIG. 12 is a graph illustrating a comparison of radiation and gain between the antenna unit consisting of the radiation patch shown in FIG. 10 and the antenna unit consisting of the radiation patch shown in FIG. 11; as shown in FIG. 12, S1 represents a graph of a simulation of gain of the antenna unit including the radiation patch shown in FIG. 10; S2 represents a graph of a simulation of gain of the antenna unit including the radiation patch shown in FIG. 11.

In some examples, the antenna module 2 in the embodiment of the present disclosure includes, in addition to the first radiation patch 21 and the second radiation patch 22, a radiation layer, in which a redundant radiation structure is further disposed, in such case, the radiation patches substantially cover the display module 1, so that the display uniformity of the display panel can be improved.

Furthermore, the radiation layer may be composed of first traces 201 and second traces 202 intersected with each other, where the first traces 201 and the second traces 202 are broken between the first radiation patch 21, the second radiation patch 22 and the redundant radiation structure. In this case, the first radiation patch 21, the second radiation patch 22 and the redundant radiation structure may be formed by breaking the first traces 201 and the second traces 202 after the first traces 201 and the second traces 202 intersected with each other are formed. Thus, the formation of the first radiation patch 21, the second radiation patch 22 and the redundant radiation structure is facilitated, and the uniformity of the transmittance of the display module 1 is facilitated.

A Third Example

Figure 13:
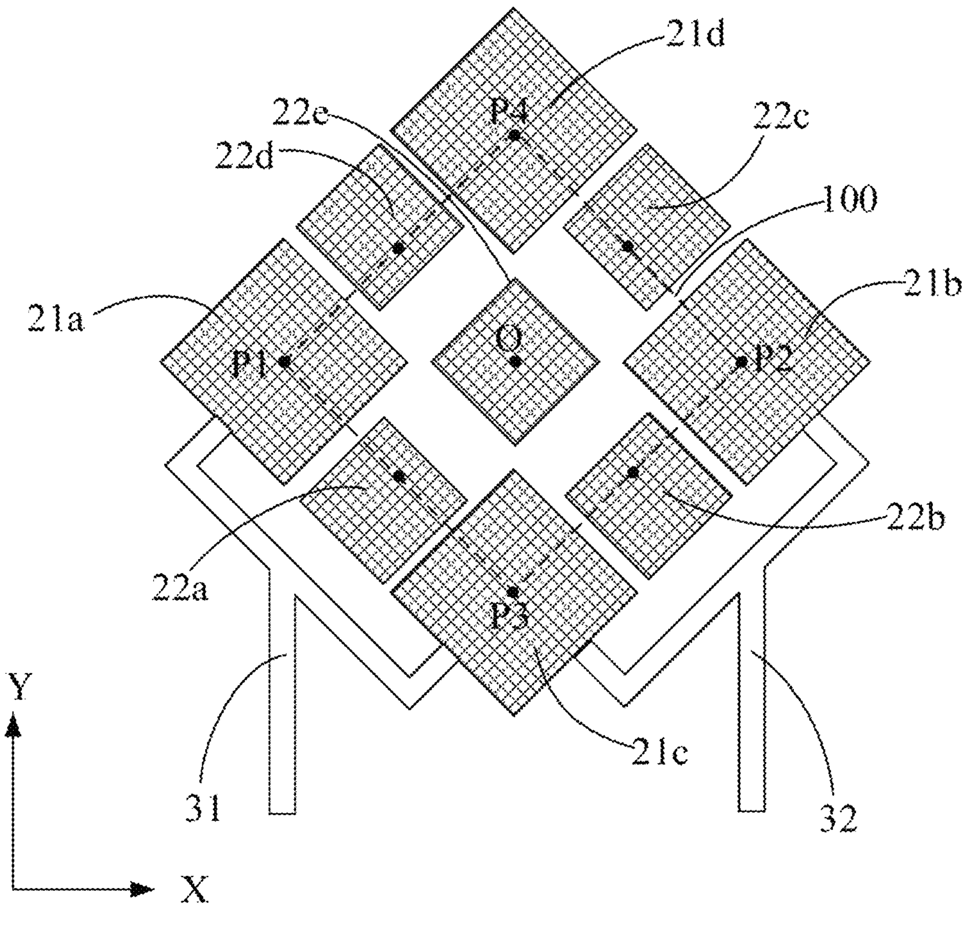
FIG. 13 is a schematic diagram of an antenna unit in a display panel in a third example of the present disclosure.

FIG. 13 is a schematic diagram of an antenna unit in a display panel in the third example of the present disclosure; as shown in FIG. 13, the antenna unit in this example is substantially the same as that in the second example in structure except that each of the second radiation patches 22 located on the sides of the virtual quadrangle 100 in this example is farther from the center O of the virtual quadrangle 100 than the second radiation patches 22 located on the sides of the virtual quadrangle 100 in the second example. Specifically, for the first radiation patches 21 and the second radiation patch 22 located on the same side of the virtual quadrangle 100, the first radiation patches 21 and the second radiation patch 22 each have a first side edge far away from the center O of the virtual quadrangle 100 and parallel to the side of the virtual quadrangle 100 where they are located, and the first side edges of the first radiation patches 21 and the first side edge of the second radiation patch 22 are located on a same straight line. In this case, an outer contour of the antenna unit is a quadrilateral.

Figure 14:
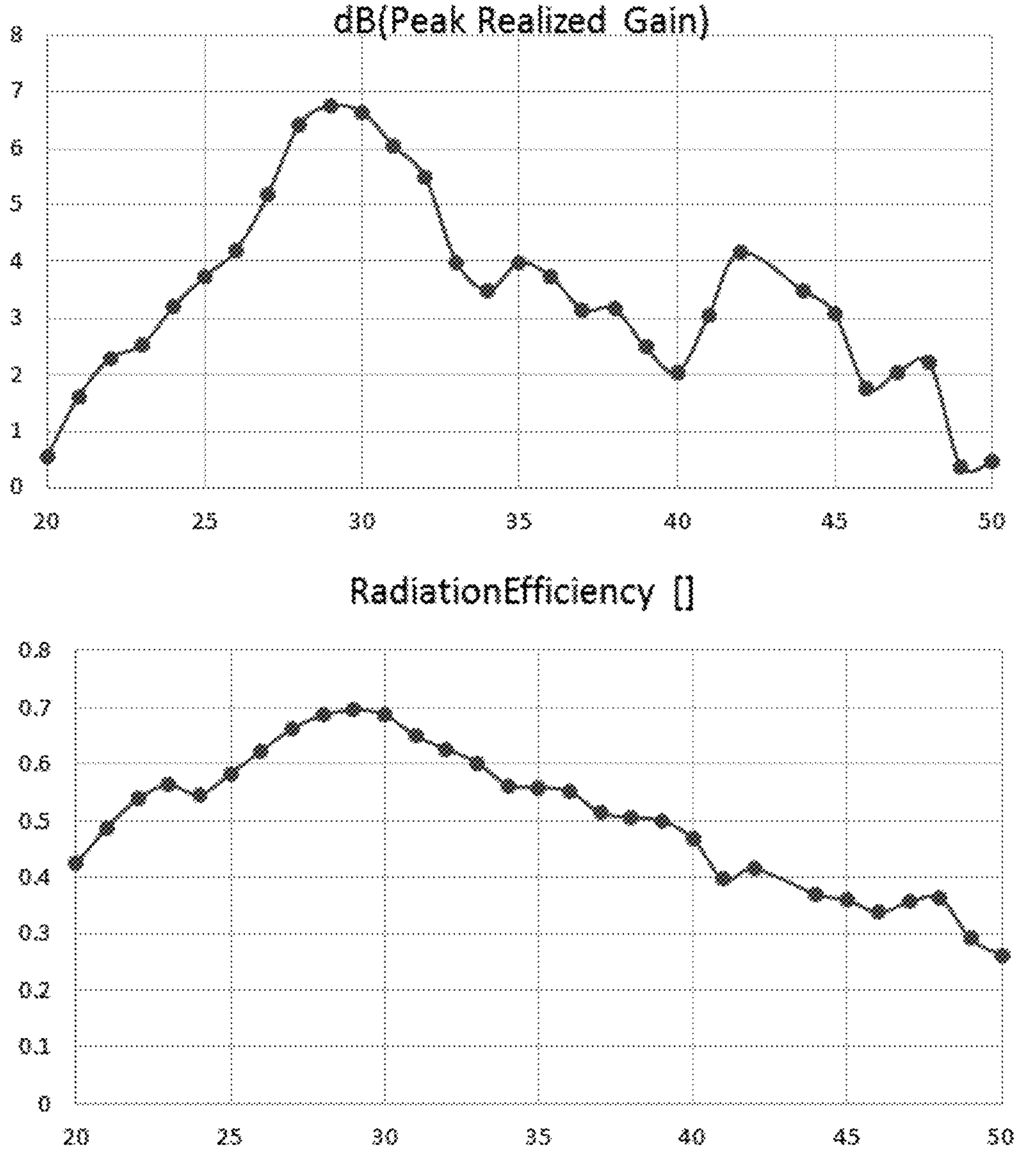
FIG. 14 is a graph illustrating a simulation of radiation efficiency and gain of the antenna unit shown in FIG. 13.

FIG. 14 is a graph illustrating a simulation of radiation efficiency and gain of the antenna unit shown in FIG. 13; as shown in FIG. 14, the radiation efficiency of the antenna unit at a frequency near or approximate to 26 GHz is significantly higher than the radiation efficiency of the antenna unit at a frequency near or approximate to 39 GHz, and the antenna unit has gains greater than 5 dBi at frequencies near or approximate to 26 GHz and 39 GHz respectively.

Furthermore, in this example, the second radiation patch 22 is coupled with the first radiation patch 21 adjacent to the second radiation patch 22. In this example, the second radiation patch 22 and the first radiation patch 21 adjacent to each other may also be connected by a connection bar.

In some examples, in the antenna module 2, the second radiation patch 22*a* close to the first feed line 31 and the second radiation patch 22*b* close to the second feed line 32 may be farther from the center O of the virtual quadrangle 100 than the second radiation patches 22 in the second example; and the centers of the second radiation patch 22*c* and the second radiation patch 22*d* are located on the sides of the virtual quadrangle 100 where they are located.

Specifically, for the first radiation patches 21 and the second radiation patch 22 located on the same side of the virtual quadrangle 100, the first radiation patches 21 and the second radiation patch 22 each have a first side edge far away from the center of the virtual quadrangle 100 and parallel to the side of the virtual quadrangle 100 where they are located, the first side edge of the first radiation patch 21*a*, the first side edge of the first radiation patch 21*c*, and the first side edge of the second radiation patch 22*a* are located on a same straight line, and the first side edge of the first radiation patch 21*b*, the first side edge of the first radiation patch 21*c*, and the first side edge of the second radiation patch 22*b* are located on a same straight line.

A Fourth Example

Figure 15:
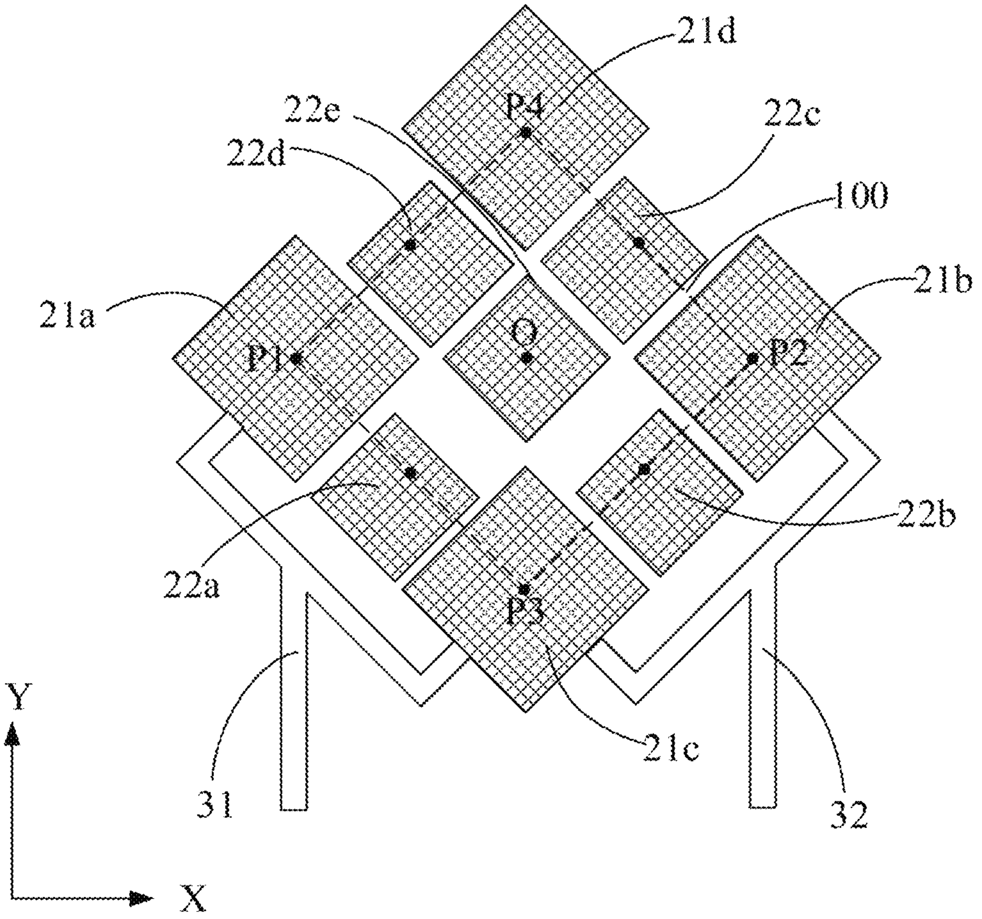
FIG. 15 is a schematic diagram of an antenna unit in a display panel in a fourth example of the present disclosure.

FIG. 15 is a schematic diagram of an antenna unit in a display panel in the fourth example of the present disclosure; as shown in FIG. 15, the antenna unit in this example is substantially the same as that in the third example in structure except that the second radiation patch 22*c* and the second radiation patch 22*d* are closer to the center O of the virtual quadrangle 100 than those in the fourth example. Specifically, each of the first radiation patches 21 and the second radiation patches 22 has a second side edge close to the center O of the virtual quadrangle 100 and parallel to the side of the virtual quadrangle 100 where it is located, and second side edges of the first radiation patch 21*a*, the first radiation patch 21*d*, and the second radiation patch 22*a* on the same side of the virtual quadrangle 100 are on a same straight line; the second side edges of the first radiation patch 21*b*, the first radiation patch 21*d*, and the second radiation patch 22*c* located on the same side of the virtual quadrangle 100 are located on a same straight line.

Figure 16:
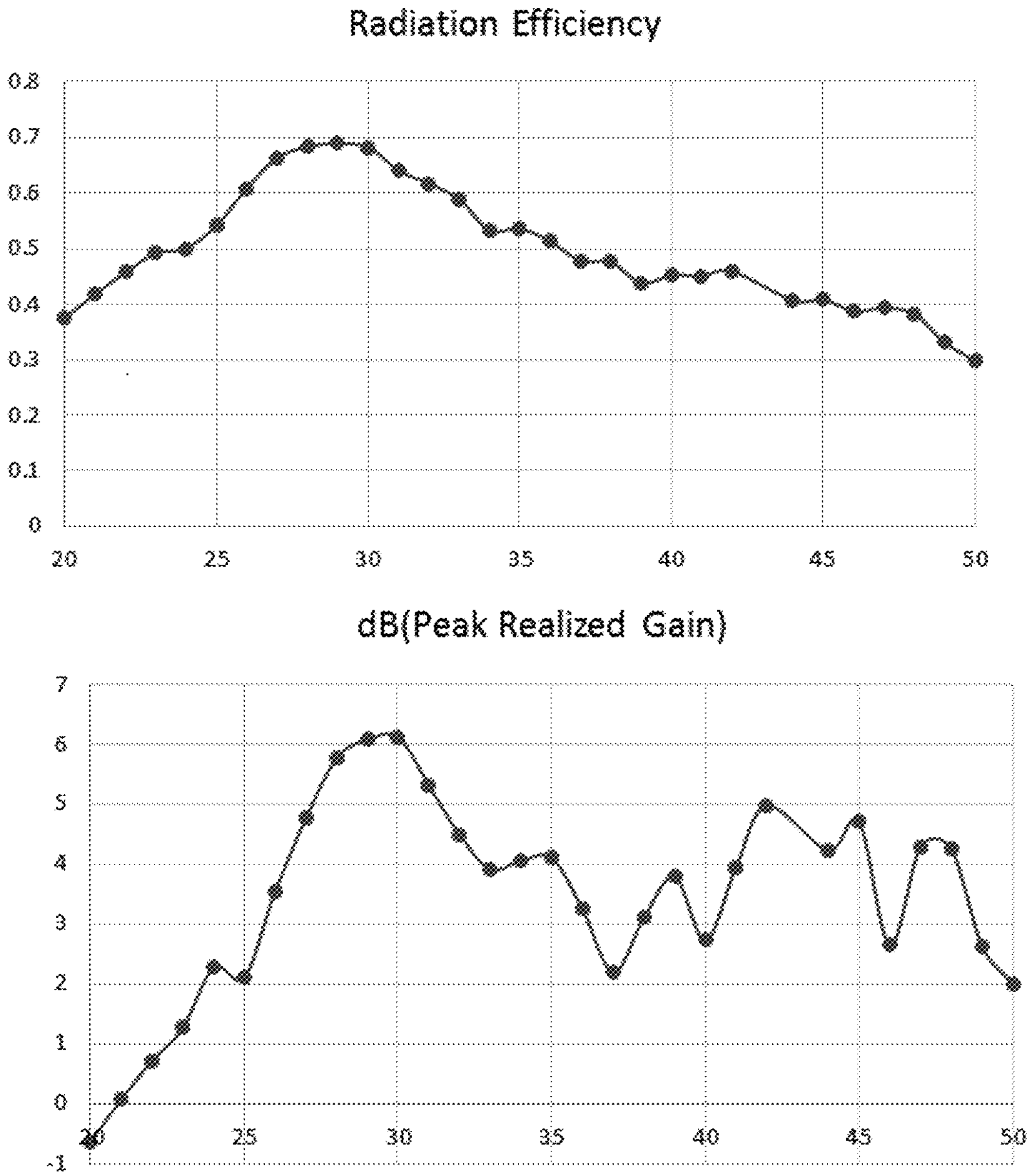
FIG. 16 is a graph illustrating a simulation of radiation efficiency and gain of the antenna unit shown in FIG. 15.

FIG. 16 is a graph illustrating a simulation of radiation efficiency and gain of the antenna unit shown in FIG. 15; as shown in FIG. 16, the radiation efficiency of the antenna unit at a frequency near or approximate to 26 GHz is significantly higher than that at a frequency near or approximate to 39 GHz, and the antenna unit has gains greater than 5 dBi at frequencies near or approximate to 26 GHz and 39 GHz respectively.

A Fifth Example

Figure 17:
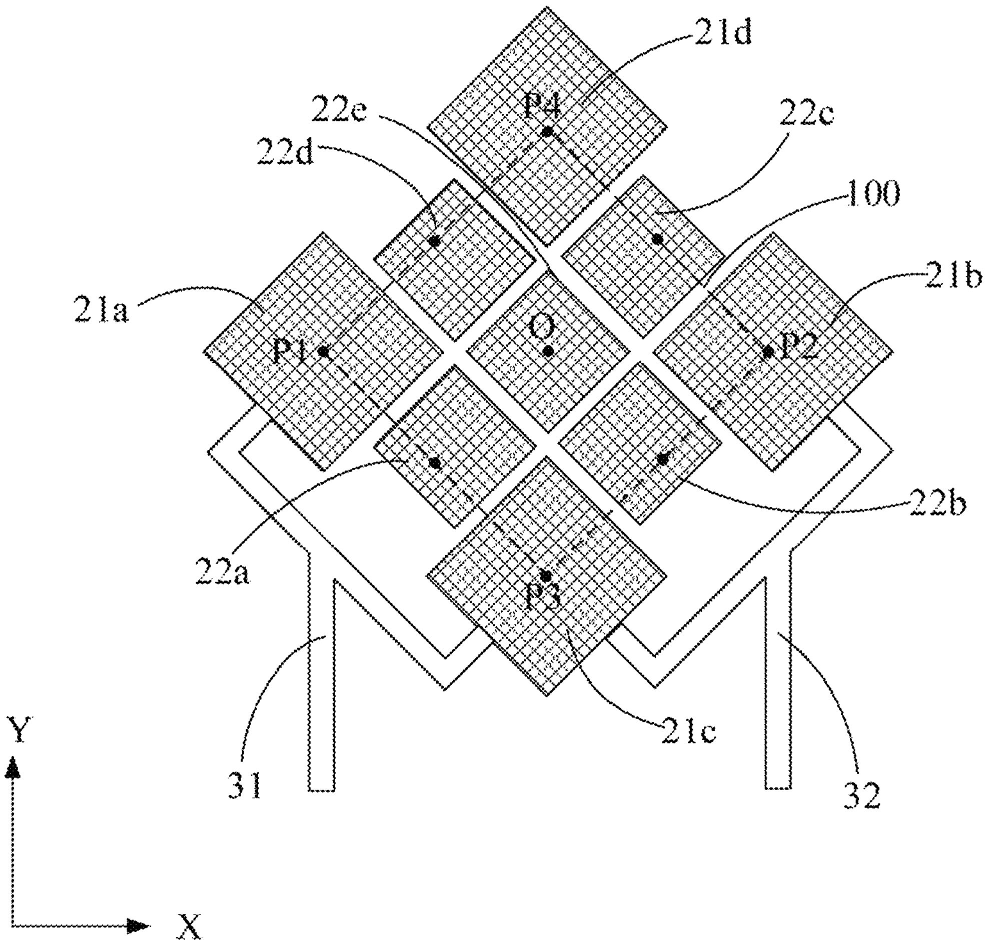
FIG. 17 is a schematic diagram of an antenna unit in a display panel in a fifth example of the present disclosure.

FIG. 17 is a schematic diagram of an antenna unit in a display panel in the fifth example of the present disclosure; as shown in FIG. 17, the antenna unit in this example is substantially the same as that in the fourth example in structure except that not only the second radiation patch 22*c* and the second radiation patch 22*d* are closer to the center O of the virtual quadrangle 100 than those in the fourth example, but also the second radiation patch 22*a* and the second radiation patch 22*b* are closer to the center O of the virtual quadrangle 100 than those in the fourth example. Specifically, the first radiation patches 21 and the second radiation patches 22 each have a second side edge, which is close to the center O of the virtual quadrangle 100 and is parallel to the side of the virtual quadrangle 100 where it is located, and the second side edges of the first radiation patch 21*a*, the first radiation patch 21*d* and the second radiation patch 22*d* on the same side of the virtual quadrangle 100 are on a same straight line; the second side edges of the first radiation patch 21*b*, the first radiation patch 21*d* and the second radiation patch 22*c* on the same side of the virtual quadrangle 100 are located on a same straight line; the second side edges of the first radiation patch 21*a*, the first radiation patch 21*c* and the second radiation patch 22*a* on the same side of the virtual quadrangle 100 are located on a same straight line; the second side edges of the first radiation patch 21*b*, the first radiation patch 21*c* and the second radiation patch 22*b* on the same side of the virtual quadrangle 100 are located on a same straight line.

Figure 18:
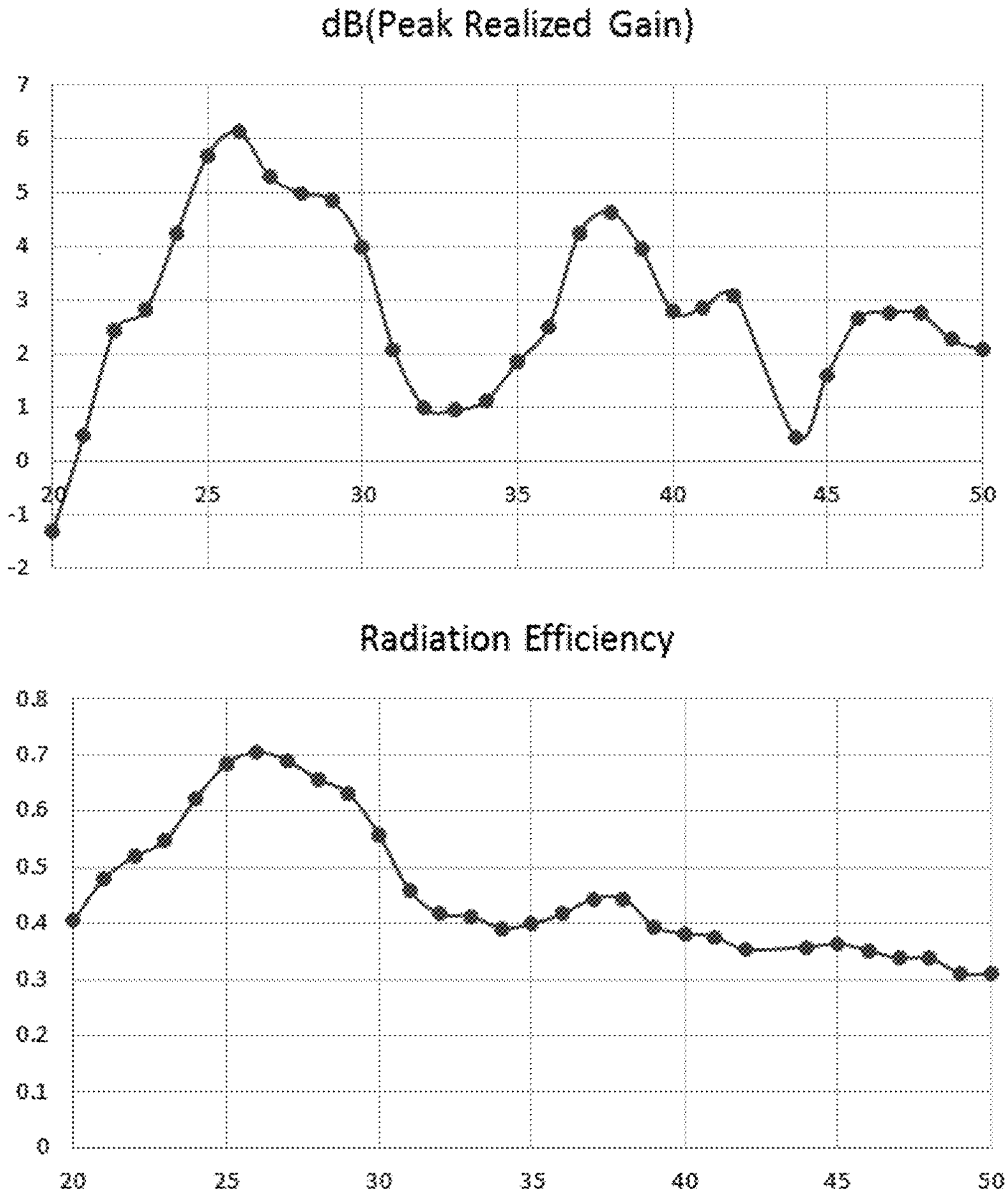
FIG. 18 is a graph illustrating a simulation of radiation efficiency and gain of the antenna unit shown in FIG. 16.

FIG. 18 is a graph illustrating a simulation of radiation efficiency and gain of the antenna unit shown in FIG. 17; as shown in FIG. 18, the radiation efficiency of the antenna unit at a frequency near or approximate to 26 GHz is significantly higher than the radiation efficiency of the antenna unit at a frequency near or approximate to 39 GHz, and the antenna unit has gains greater than 5 dBi at frequencies near or approximate to 26 GHz and 39 GHz respectively.

A Sixth Example

Figure 19:
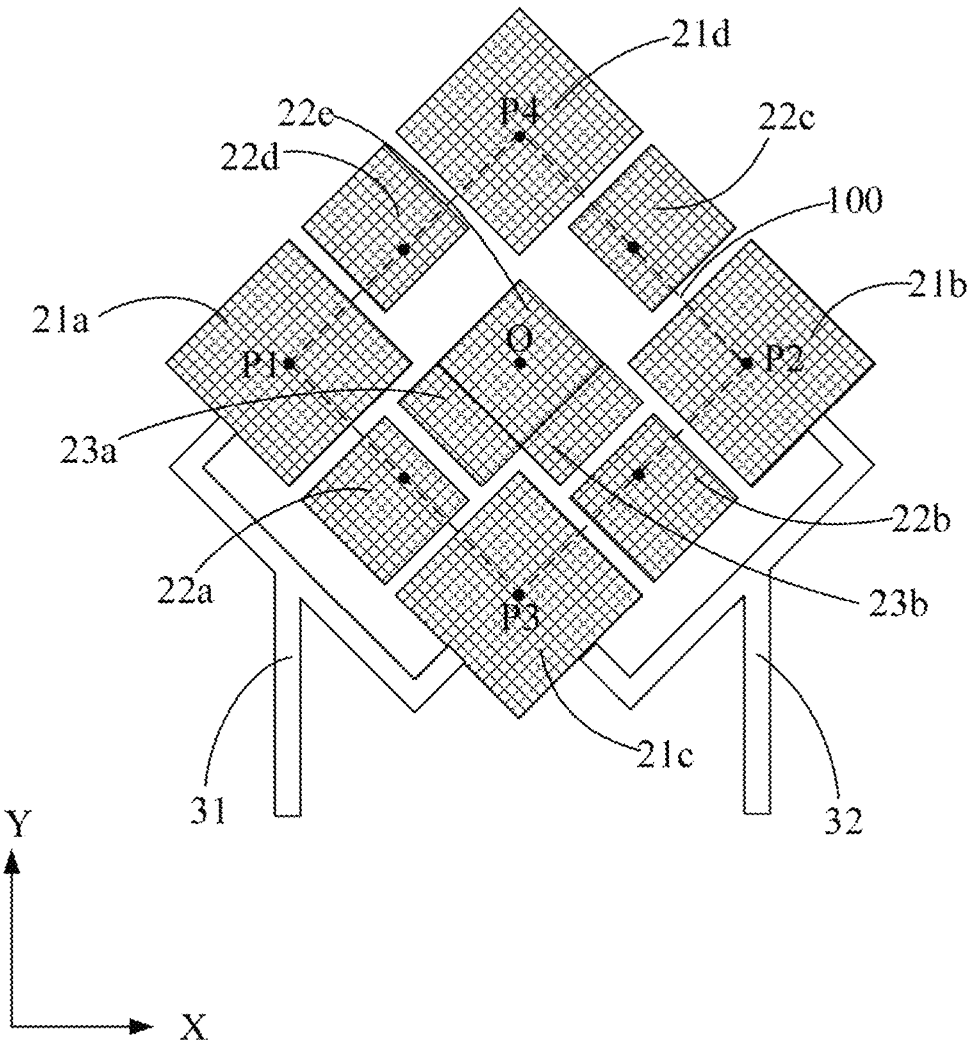
FIG. 19 is a schematic diagram of an antenna unit in a display panel in a sixth example of the present disclosure.

FIG. 19 is a schematic diagram of an antenna unit in a display panel in a sixth example of the present disclosure; as shown in FIG. 19, the antenna unit in this example is substantially the same as that in the third example in structure except that an auxiliary radiation patch is connected to at least one of side edges of the second radiation patch 22*e* located at the center of the virtual quadrangle 100. Referring to FIG. 19, auxiliary radiation patches are connected to two side edges of the second radiation patch 22*e*, one of the auxiliary radiation patches extends between the first radiation patch 21*a* and the first radiation patch 21*c*, and the other of the auxiliary radiation patches extends between the first radiation patch 21*b* and the first radiation patch 21*c*.

Figure 20:
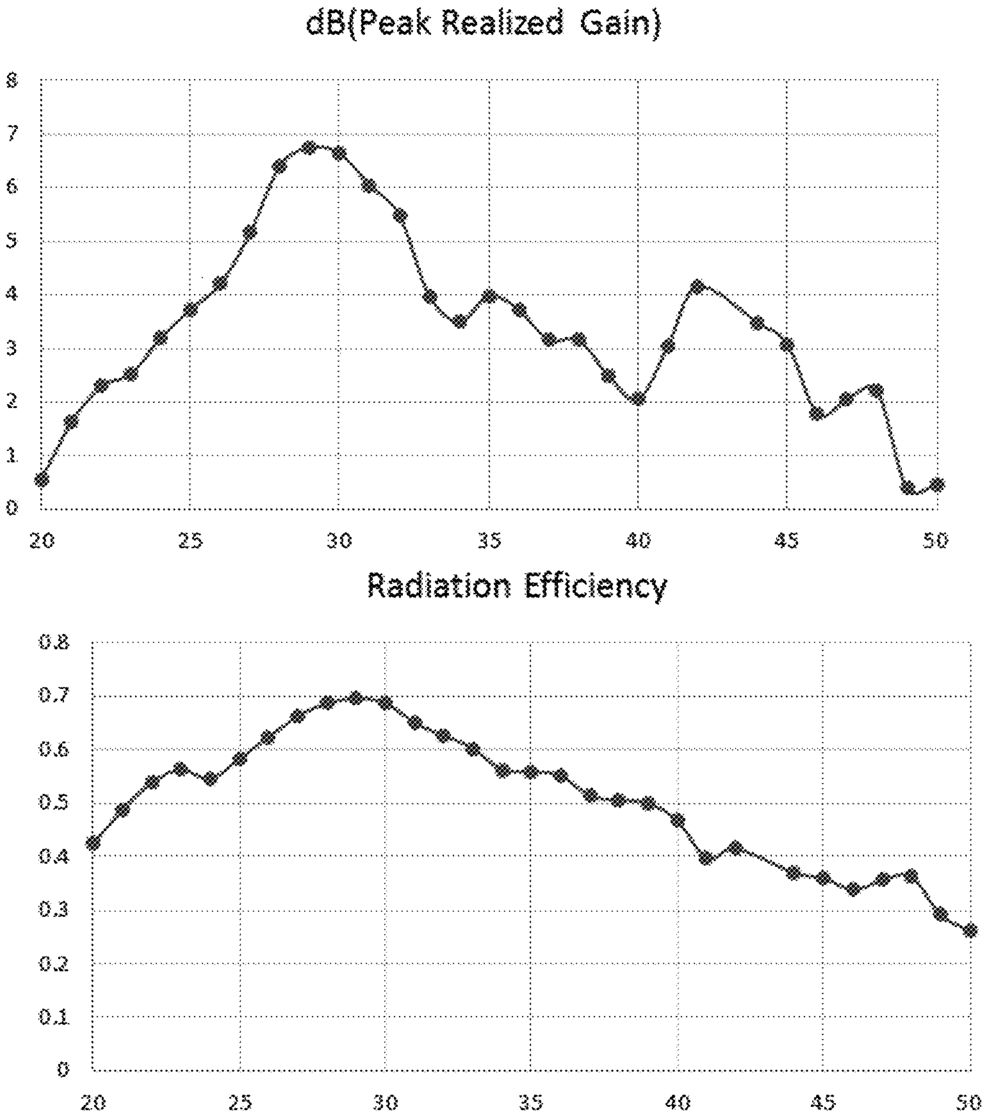
FIG. 20 is a graph illustrating a simulation of radiation efficiency and gain of the antenna unit shown in FIG. 19.

FIG. 20 is a graph illustrating a simulation of radiation efficiency and gain of the antenna unit shown in FIG. 19; as shown in FIG. 20, the radiation efficiency of the antenna unit at a frequency near or approximate to 26 GHz is significantly higher than the radiation efficiency of the antenna unit at a frequency near or approximate to 39 GHz, and the antenna unit has gains greater than 5 dBi at frequencies near or approximate to 26 GHz and 39 GHz respectively.

A Seventh Example

Figure 21:
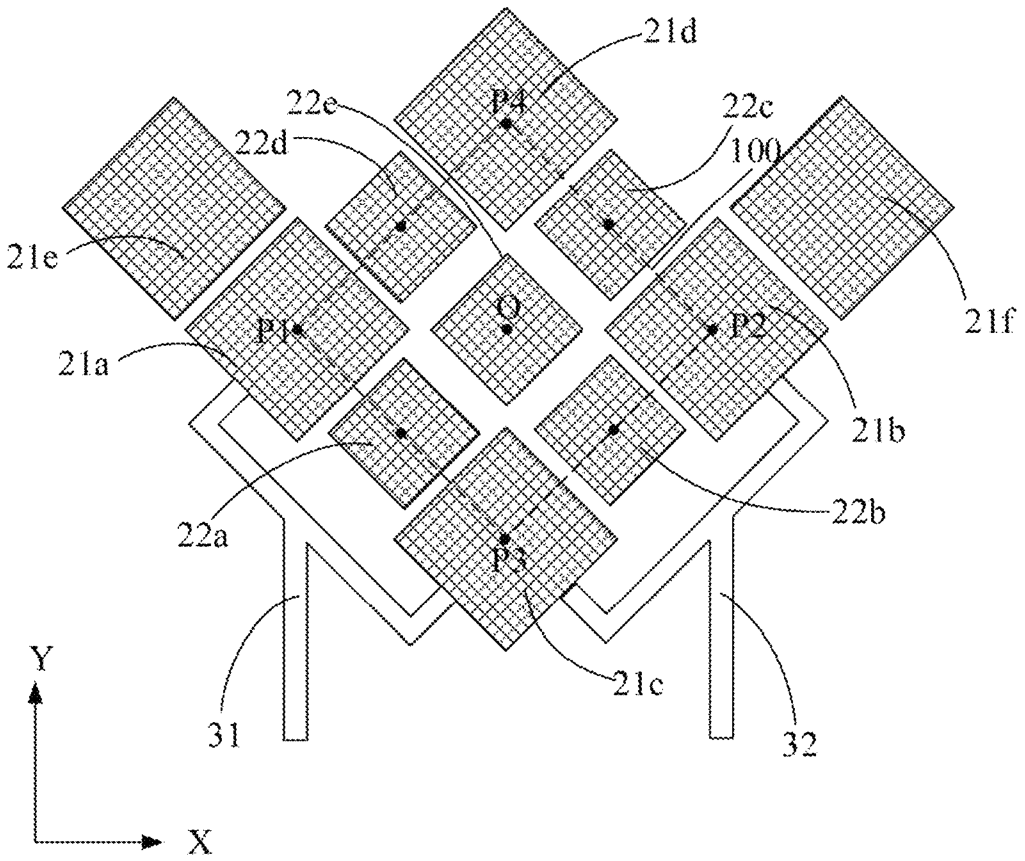
FIG. 21 is a schematic diagram of an antenna unit in a display panel in a seventh example of the present disclosure.

FIG. 21 is a schematic diagram of an antenna unit in a display panel in the seventh example of the present disclosure; as shown in FIG. 21, the antenna unit in this example is substantially the same as that in the second example in structure except that two first radiation patches 21 are added in this example, and the two first radiation patches 21 are located on a side of the first radiation patch 21*a* and a side of the second radiation patch 22*b* respectively. In this example, since the first radiation patches 21, that is, low frequency radiation patches are added, a bandwidth at a low frequency can be increased.

Figure 22:
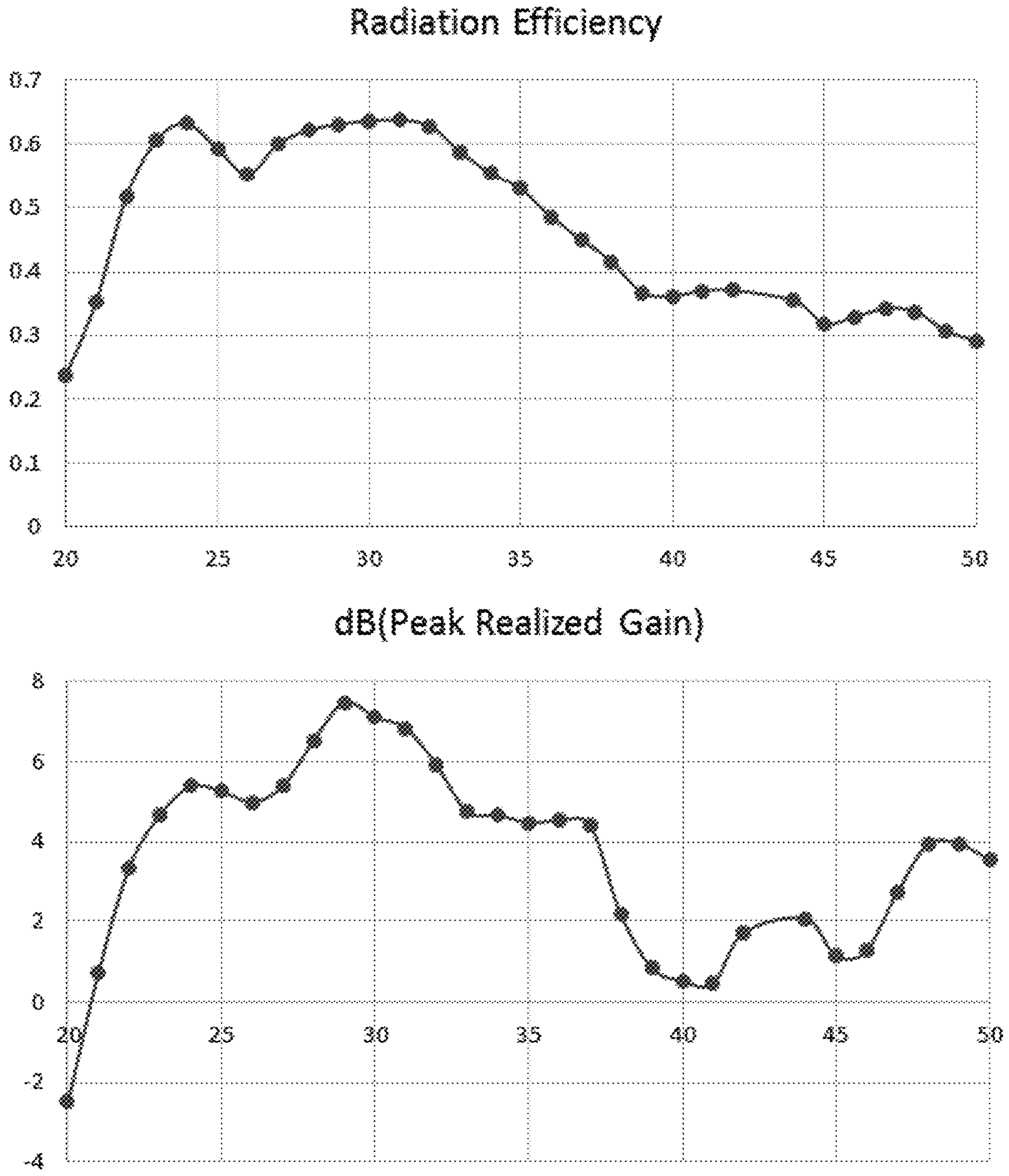
FIG. 22 is a graph illustrating a simulation of radiation efficiency and gain of the antenna unit shown in FIG. 21.

FIG. 22 is a graph illustrating a simulation of radiation efficiency and gain of the antenna unit shown in FIG. 20; as shown in FIG. 22, the radiation efficiency of the antenna unit at a frequency near or approximate to 26 GHz is significantly higher than the radiation efficiency of the antenna unit at a frequency near or approximate to 39 GHz, and the antenna unit has gains greater than 5 dBi at frequencies near or approximate to 26 GHz and 39 GHz respectively.

In some examples, no matter the antenna module 2 in the embodiment of the present disclosure adopts any one of the above modes, the antenna module 2 further includes a transceiver unit, a radio frequency transceiver, a signal amplifier, a power amplifier, and a filtering unit. The antenna in a communication device may serve as a transmitting antenna or a receiving antenna. The transceiver unit may include a baseband and a receiving terminal, the baseband provides a signal of at least one frequency band, for example, provides a 2G signal, a 3G signal, a 4G signal, a 5G signal, and transmits the signal of at least one frequency band to the radio frequency transceiver. After receiving the signal, the antenna in the communication system may transmit the signal, processed by the filtering unit, the power amplifier, the signal amplifier, and the radio frequency transceiver, to the receiving terminal in the transceiver unit, and the receiving terminal may be, for example, an intelligent gateway.

Furthermore, the radio frequency transceiver is connected to the transceiver unit, and is configured to modulate the signal transmitted by the transceiver unit, or demodulate a signal received by the antenna and transmit the modulated signal to the transceiver unit. Specifically, the radio frequency transceiver may include a transmitting circuit, a receiving circuit, a modulating circuit, and a demodulating circuit, after the transmitting circuit receives multiple types of signals provided by the baseband, the modulating circuit may modulate the multiple types of signals provided by the baseband and then transmit the signals to the antenna. The antenna receives signals and transmits the signals to the receiving circuit of the radio frequency transceiver, the receiving circuit transmits the signals to the demodulating circuit, and the demodulating circuit demodulates the signals and transmits the demodulated signals to the receiving terminal.

Furthermore, the radio frequency transceiver is connected to the signal amplifier and the power amplifier, the signal amplifier and the power amplifier are further connected to the filtering unit, and the filtering unit is connected with at least one antenna. In the process of transmitting a signal by the antenna system, the signal amplifier is configured to improve the signal-to-noise ratio of the signal output by the radio frequency transceiver and then transmit the signal to the filtering unit; the power amplifier is configured to amplify power of the signal output by the radio frequency transceiver and then transmit the signal to the filtering unit; the filtering unit may include a duplexer and a filtering circuit, and combines signals output by the signal amplifier and the power amplifier, filters clutter out and then transmits the combined signal to the antenna, and the antenna radiates the signal out. In the process of receiving a signal by the antenna system, after receiving the signal, the antenna transmits the signal to the filtering unit, the filtering unit filters the signal received by the antenna to remove clutter and then transmits the signal to the signal amplifier and the power amplifier, and the signal amplifier gains the signal received by the antenna to increase the signal-to-noise ratio of the signal; the power amplifier amplifies the power of the signal received by the antenna. The signal received by the antenna is processed by the power amplifier and the signal amplifier and then transmitted to the radio frequency transceiver, and then the radio frequency transceiver transmits the signal to the transceiver unit.

In some examples, the signal amplifier may include various types of signal amplifiers, such as a low noise amplifier, which is not limited herein.

In some examples, the display panel provided by the embodiment of the present disclosure further includes a power management unit, which is connected to the power amplifier, for providing a voltage for amplifying the signal to the power amplifier.

It will be understood that the above implementations are merely exemplary implementations employed to illustrate the principles of the present disclosure, but the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A display panel, comprising: a display module and an antenna module located on a side of a display surface of the display module, wherein the antenna module comprises an antenna unit; the antenna unit comprises a dielectric substrate, a radiation structure arranged on the dielectric substrate, a first feed line and a second feed line feeding the radiation structure and electrically connected with the radiation structure, feeding directions of the first feed line and the second feed line are different; the radiation structure comprises radiation patches for at least two radiation frequency bands, and the radiation patches are electrically connected, wherein the radiation structure comprises radiation patches for two radiation frequency bands, which are first radiation patches and second radiation patches, respectively; the radiation frequency band of the first radiation patches is smaller than that of the second radiation patches; the first feed line and the second feed line are both electrically connected with the first radiation patches, the number of the first radiation patches is four, and connection lines connecting centers of the four first radiation patches constitutes a virtual quadrangle; the second radiation patches are arranged on four sides of the virtual quadrangle and inside the virtual quadrangle, and each of the second radiation patches located on the four sides of the virtual quadrangle is arranged between two adjacent first radiation patches, and four vertices of the virtual quadrangle comprise a first vertex and a second vertex arranged along a first direction, and a third vertex and a fourth vertex arranged along a second direction, respectively; the first feed line is electrically connected with the first radiation patch with the center being located at the first vertex, and the second feed line is electrically connected with the second radiation patch with a center being located at the second vertex.

2. The display panel according to claim 1, wherein the first feed line is connected to the first radiation patch corresponding thereto at a first node, and the second feed line is connected to the first radiation patch corresponding thereto at a second node; a connection line between the first node and the first vertex is a first line segment, and a connection line between the second node and the second vertex is a second line segment; an extending direction in which the first line segment extends and an extending direction in which the second line segment extends are perpendicular to each other.

3. The display panel according to claim 1, wherein four vertices of the virtual quadrangle comprise a first vertex and a second vertex arranged along a first direction, and a third vertex and a fourth vertex arranged along a second direction, respectively; the first feed line comprises a first feed end and two second feed ends; the second feed line comprises a third feed end and two fourth feed ends; one of the second feed ends is electrically connected with the first radiation patch located on the first vertex at a third node; the other of the second feed ends is electrically connected with the first radiation patch located on the third vertex at a fourth node; one of the fourth feed ends is electrically connected with the first radiation patch located on the second vertex at a fifth node, and the other of the fourth feed ends is electrically connected with the first radiation patch located on the third vertex at a sixth node; a connection line between the third node and the first vertex is a third line segment, a connection line between the fourth node and the third vertex is a fourth line segment, a connection line between the fifth node and the second vertex is a fifth line segment, and a connection line between the sixth node and the third vertex is a sixth line segment;

an extending direction in which the third line segment extends is the same as an extending direction in which the fourth line segment extends, an extending direction in which the fifth line segment extends is the same as an extending direction in which the sixth line segment extends, and the extending direction in which the third line segment extends is different from the extending direction in which the fifth line segment extends, wherein the extending direction in which the third line segment extends and the the extending direction in which the fifth line segment extends are perpendicular to each other.

4. The display panel according to claim 1, wherein at least one of the second radiation patches located on four sides of the virtual quadrangle is connected to one of the first radiation patches adjacent thereto through a connection bar.

5. The display panel according to claim 1, wherein for any second radiation patch located on the side of the virtual quadrilateral, a center of the second radiation patch is located on the side of the virtual quadrilateral, and for any second radiation patch located on the side of the virtual quadrilateral, the center of the second radiation patch is located at a midpoint of the side of the virtual quadrilateral.

6. The display panel according to claim 1, wherein a center of each of at least a part of the second radiation patches is located on a side of the side of the virtual quadrilateral away from the center of the virtual quadrilateral.

7. The display panel according to claim 6, wherein, for a part of the first radiation patches and the second radiation patches that are located on a same side of the virtual quadrangle, the first radiation patch and the second radiation patch each have a first side edge that is away from the center of the virtual quadrangle and parallel to the side of the virtual quadrangle on which they are located, and first side edges of the first radiation patch and the second radiation patch are located on a same straight line.

8. The display panel according to claim 1, wherein a center of each of at least a part of the second radiation patches is located on a side of the side of the virtual quadrilateral close to the center of the virtual quadrilateral.

9. The display panel according to claim 8, wherein for at least a part of the first radiation patches and the second radiation patches that are located on a same side of the virtual quadrilateral, the first radiation patch and the second radiation patch each have a second side edge that is close to the center of the virtual quadrilateral and parallel to the side of the virtual quadrilateral, second side edges of the first radiation patch and the second radiation patch are located on a same straight line.

10. The display panel according to claim 1, wherein each of the radiation patches comprises a plurality of first traces and a plurality of second traces, and the first traces are intersected with the second traces to define a plurality of hollow-out portions.

11. The display panel according to claim 10, wherein ends of the first traces and ends of the second traces of the radiation patches are separated from each other at edges of the radiation patches.

12. The display panel according to claim 10, wherein ends of the first traces of each of the radiation patches are connected to the second traces at edges of each of the radiation patches, and ends of the second traces of each of the radiation patches are connected to the first traces at edges of each of the radiation patches.

13. The display panel according to claim 1, wherein the antenna module comprises a radiation layer on a side of a display surface of the display panel; the radiation structure in the antenna unit is located in the radiation layer and the radiation layer further comprises a redundant radiation structure.

14. The display panel according to claim 13, wherein the radiation layer comprises a plurality of first traces and a plurality of second traces, which are intersected, and the first traces and the second traces are broken between the radiation structure and the redundant radiation structure.

15. The display panel according to claim 1, wherein a touch control component is integrated in the display module.

16. A display panel, comprising: a display module and an antenna module located on a side of a display surface of the display module, wherein the antenna module comprises an antenna unit; the antenna unit comprises a dielectric substrate, a radiation structure arranged on the dielectric substrate, a first feed line and a second feed line feeding the radiation structure and electrically connected with the radiation structure, feeding directions of the first feed line and the second feed line are different; the radiation structure comprises radiation patches for at least two radiation frequency bands, and the radiation patches are electrically connected, wherein the radiation structure comprises radiation patches for two radiation frequency bands, which are first radiation patches and second radiation patches, respectively; the radiation frequency band of the first radiation patches is smaller than that of the second radiation patches; the first feed line and the second feed line are both electrically connected with the first radiation patches, the number of the first radiation patches is four, and connection lines connecting centers of the four first radiation patches constitutes a virtual quadrangle; the second radiation patches are arranged on four sides of the virtual quadrangle and inside the virtual quadrangle, and each of the second radiation patches located on the four sides of the virtual quadrangle is arranged between two adjacent first radiation patches, and for the second radiation patch located at the center of the virtual quadrangle, an auxiliary radiation patch is connected to at least one side of the second radiation patch.

17. A display panel, comprising: a display module and an antenna module located on a side of a display surface of the display module, wherein the antenna module comprises an antenna unit; the antenna unit comprises a dielectric substrate, a radiation structure arranged on the dielectric substrate, a first feed line and a second feed line feeding the radiation structure and electrically connected with the radiation structure, feeding directions of the first feed line and the second feed line are different; the radiation structure comprises radiation patches for at least two radiation frequency bands, and the radiation patches are electrically connected, wherein the radiation structure comprises radiation patches for two radiation frequency bands, which are first radiation patches and second radiation patches, respectively; the radiation frequency band of the first radiation patches is smaller than that of the second radiation patches; the first feed line and the second feed line are both electrically connected with the first radiation patches, the number of the first radiation patches is four, and connection lines connecting centers of the four first radiation patches constitutes a virtual quadrangle; the second radiation patches are arranged on four sides of the virtual quadrangle and inside the virtual quadrangle, and each of the second radiation patches located on the four sides of the virtual quadrangle is arranged between two adjacent first radiation patches, and for the second radiation patch located at the center of the virtual quadrilateral, a center of the second radiation patch is located at the center of the virtual quadrilateral.

* * * * *